(12) United States Patent
Sugita

(10) Patent No.: US 8,144,038 B2
(45) Date of Patent: Mar. 27, 2012

(54) SIGNAL PROCESSING APPARATUS, SIGNAL PROCESSING SYSTEM AND SIGNAL PROCESSING METHOD

(75) Inventor: Takehiro Sugita, Kanagawa (JP)

(73) Assignee: Sony Corporation, Tokyo (JP)

(*) Notice: Subject to any disclaimer, the term of this patent is extended or adjusted under 35 U.S.C. 154(b) by 370 days.

(21) Appl. No.: 12/472,500

(22) Filed: May 27, 2009

(65) Prior Publication Data

US 2009/0295450 A1 Dec. 3, 2009

(30) Foreign Application Priority Data

May 29, 2008 (JP) ................ P2008-140992

(51) Int. Cl.
*H03M 9/00* (2006.01)
(52) U.S. Cl. .................. 341/100; 370/252; 375/224
(58) Field of Classification Search .......... 341/100–101; 375/224; 370/252
See application file for complete search history.

(56) References Cited

U.S. PATENT DOCUMENTS

| | | | | |
|---|---|---|---|---|
| 6,005,265 | A * | 12/1999 | Kuroda | 257/208 |
| 6,529,548 | B1 * | 3/2003 | Aoki et al. | 375/224 |

2005/0280509 A1 12/2005 Tanaka et al.

FOREIGN PATENT DOCUMENTS

| | | |
|---|---|---|
| EP | 1 607 764 A1 | 12/2005 |
| GB | 2 242 105 A | 9/1991 |
| JP | 2006-5651 | 1/2006 |

OTHER PUBLICATIONS

Y. Yuminaka et al., "Time-Domain Pre-Emphasis Techniques for Equalization of Multiple-Valued Data", 38$^{th}$ International Symposium on Multiple Valued Logic, pp. 20-25 (2008).
European Search Report issued Jul. 12, 2010, in Berlin, in European Patent Application No. 09 16 1320.

* cited by examiner

*Primary Examiner* — Lam T Mai
(74) *Attorney, Agent, or Firm* — Finnegan, Henderson, Farabow, Garrett & Dunner, L.L.P.

(57) ABSTRACT

A signal processing apparatus is provided, which generates a data signal having a signal waveform corresponding to a first bit value of a signal waveform transitioning from a high level to a low level or a signal waveform transitioning from a low level to a high level, a pre-transition signal level corresponding to a second bit value of one of a plurality of high levels and a plurality of low levels, and a post-transition signal level corresponding to a third bit value of the other.

8 Claims, 23 Drawing Sheets

SIGNAL PROCESSING APPARATUS, SIGNAL PROCESSING SYSTEM AND SIGNAL PROCESSING METHOD

BACKGROUND OF THE INVENTION

1. Field of the Invention

The present invention relates to a signal processing apparatus, a signal processing system, and a signal processing method.

2. Description of the Related Art

Mobile terminals exemplified by mobile phones frequently include a movable member as a connecting portion between an operation portion operated by a user and a display portion in which information is displayed. For example, an opening/closing structure of a folding mobile phone is typical of such a movable member. Further, in addition to the calling and mail functions, recent mobile phones have a viewing function of images or an imaging function, and thus it is necessary for the connecting portion to be movable complexly in accordance with usage of the user. When the viewing function of images is used, for example, the user desires to direct the display portion toward the user and the operation portion unnecessary for viewing put away. Thus, a structure allowing the orientation or position of the display portion to change in accordance with usage thereof when a mobile phone is used as an ordinary phone, used as a digital camera, used as a TV set and the like is demanded.

As a matter of fact, a large number of signal lines and power lines are wired through the connecting portion between the operation portion and display portion. For example, several tens of wires are connected in parallel in the display portion. Thus, if a movable member capable of making complex motions described above is used as a connecting portion, reliability and the like of such wires will significantly decrease. For such reasons, technology used is being shifted from the parallel transmission method to the serial transmission method to reduce the number of signal lines in the connecting portion. Naturally, a technological shift for similar reasons is not limited to the world of mobile phones and occurs in the world of various electronic devices in which complex wiring is needed. In addition to the above reason, serialization also aims to reduce electromagnetic noise (EMI: Electro Magnetic Interference).

In the serial transmission method, transmission data is transmitted after being encoded according to a predetermined method. For example, the NRZ (Non Return to Zero) coding mode, Manchester coding mode, or AMI (Alternate Mark Inversion) coding mode is used as the coding mode. The Manchester coding mode is a mode in which a bit value is represented by transitioning of a signal level from a high level to a low level or from a low level to a high level within a cycle. Further, Japanese Patent Application Laid-Open No. 2006-5651 describes, in the Manchester coding mode, a technology to represent a plurality of bit values within a cycle by varying the high level while the low level being fixed.

SUMMARY OF THE INVENTION

However, according to the technology in Japanese Patent Application Laid-Open No. 2006-5651, the low level is fixed and therefore, the whole signal level will significantly be biased toward the low-level side so that an occurrence of a DC component is anticipated. Consequently, the technology in Japanese Patent Application Laid-Open No. 2006-5651 has an issue that it is difficult to superimpose an encoded signal on a power supply having a DC component.

The present invention has been made in view of the above issue, and it is desirable to provide a novel and improved signal processing apparatus capable of increasing the data transmission amount while suppressing an occurrence of a DC component, a signal processing system, and a signal processing method.

According to an embodiment of the present invention, there is provided a signal processing apparatus, including a generation unit that generates a data signal having a signal waveform corresponding to a first bit value of a signal waveform transitioning from a high level to a low level or that transitioning from a low level to a high level, a pre-transition signal level corresponding to a second bit value of one of a plurality of high levels and a plurality of low levels, and a post-transition signal level corresponding to a third bit value of the other.

The signal processing apparatus may further include a clock generation unit that generates a clock signal having a predetermined frequency, a first attenuation unit that attenuates a signal component in the vicinity of the predetermined frequency of a data signal generated by the generation unit, and an adder that adds the clock signal and the data signal with the signal component attenuated by the first attenuation unit.

The signal processing apparatus may further include a second attenuation unit that attenuates the clock signal, in which the adder may add a data signal whose signal component is attenuated by the first attenuation unit and a clock signal attenuated by the second attenuation unit.

According to another embodiment of the present invention, there is provided a signal processing apparatus, including a first determination unit that determines a first bit value based on whether a signal waveform of a data signal is a signal waveform transitioning from a high level to a low level or transitioning from a low level to a high level, a second determination unit that determines a second bit value based on a pre-transition signal level of the data signal, and a third determination unit that determines a third bit value based on a post-transition signal level of the data signal.

The signal processing apparatus may further include an absolute value generation unit that generates an absolute value of the signal level of the data signal, in which the second determination unit determines the second bit value based on a pre-transition absolute level generated as an absolute value by the absolute value generation unit, and the third determination unit may determine the third bit value based on a post-transition absolute level generated as an absolute value by the absolute value generation unit.

The signal processing apparatus may further include an input unit into which an input signal containing a clock signal having a predetermined frequency is input, an extraction unit that extracts the clock signal from the input signal, and an attenuation unit that attenuates a signal component in the vicinity of the predetermined frequency of the input signal and outputs the signal component as the data signal.

According to another embodiment of the present invention, there is provided a signal processing system, including a first signal processing apparatus that generates a data signal having a signal waveform corresponding to a first bit value of a signal waveform transitioning from a high level to a low level or that transitioning from a low level to a high level, a pre-transition signal level corresponding to a second bit value of one of a plurality of high levels and a plurality of low levels, and a post-transition signal level corresponding to a third bit value of the other and a second signal processing apparatus, including a first determination unit that determines a first bit value based on whether a signal waveform of a data signal from the first signal processing apparatus is a signal waveform transitioning from the high level to the low level or that transitioning from the low level to the high level, a second determination unit that determines the second bit value based on the pre-transition signal level of the data signal, and a third determination unit that determines the third bit value based on the post-transition level of the data signal.

According to another embodiment of the present invention, there is provided a signal processing method, including the steps of selecting one of a signal waveform with a signal level transitioning from a high level to a low level or with a signal level transitioning from a low level to a high level, in accordance with a first bit value, generating a data signal having a signal waveform selected during the above step, in which a pre-transition signal level is one of a plurality of high levels or one of a plurality of low levels, and a post-transition signal level is of the other, determining a first bit value based on whether the signal waveform of the data signal is a signal waveform transitioning from the high level to the low level or that transitioning from the low level to the high level, determining a second bit value based on the pre-transition level of the data signal, and determining a third bit value based on the post-transition level of the data signal.

According to the embodiments of the present invention described above, the data transmission amount can be increased while suppressing an occurrence of a DC component.

DETAILED DESCRIPTION OF THE PREFERRED EMBODIMENTS

Figure 1:
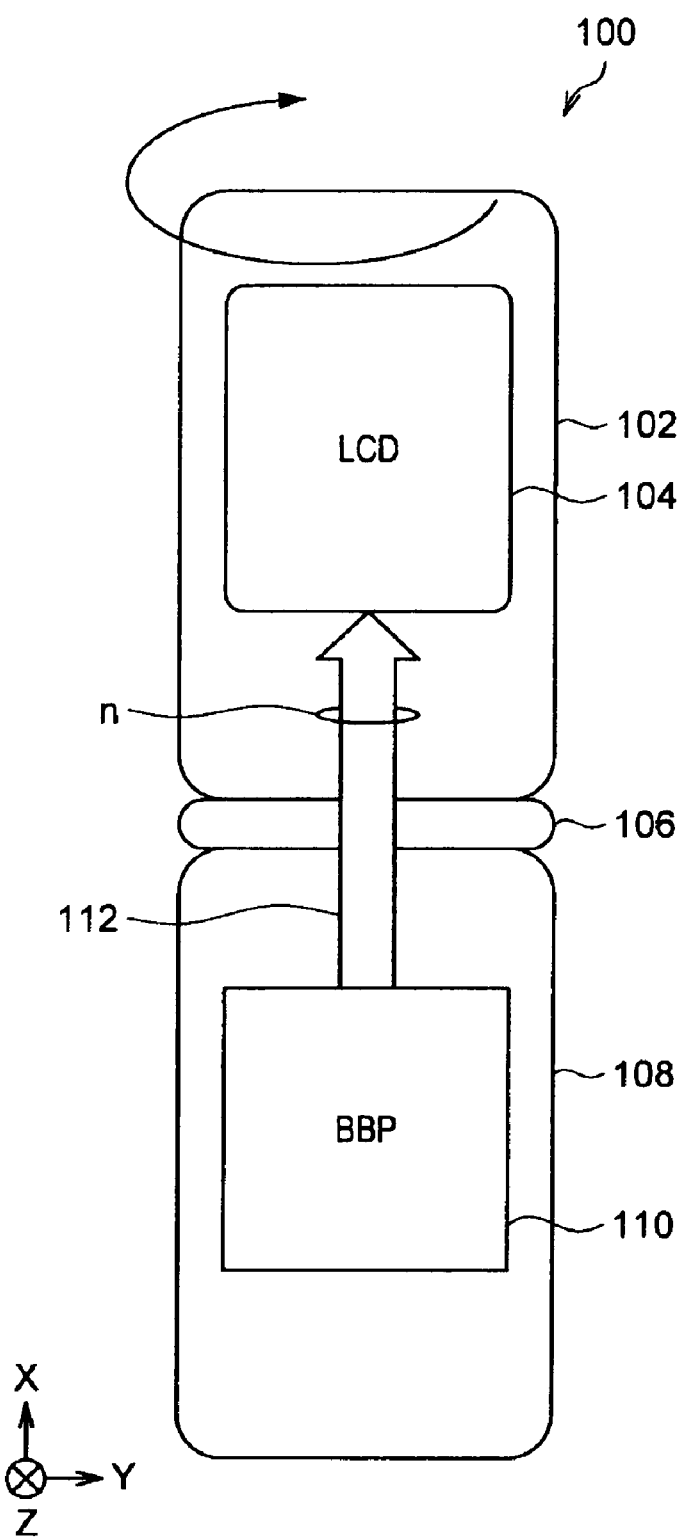
FIG. 1 is an explanatory view showing an example of a configuration of a mobile terminal.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

The "DETAILED DESCRIPTION OF THE PREFERRED EMBODIMENTS" will be described according to the item sequence shown below:

(1) Overview of the present embodiment
   Parallel transmission method
   Serial transmission method
   Overall configuration of mobile terminal
   Application example
   General Manchester code
(2) Detailed description of the first embodiment
   Serializer
   Deserializer
   Decoder modification
(3) Detailed description of the second embodiment
(4) Summary

(1) Overview of the Present Embodiment (Parallel Transmission Method)

A configuration example of a mobile terminal 100 in which a parallel transmission method is adopted will be briefly described with reference to FIG. 1. FIG. 1 is an explanatory view showing a configuration example of the mobile terminal 100 in which the parallel transmission method is adopted. In FIG. 1, a mobile phone is schematically illustrated as an example of the mobile terminal 100. However, the below-described technology is not limited to the mobile phone.

As shown in FIG. 1, the mobile terminal 100 mainly includes a display unit 102, a liquid crystal unit 104 (LCD), a connection unit 106, an operation unit 108, a baseband processor 110 (BBP), and a parallel signal line 112. Incidentally, the display unit 102 may be referred to as a display side and the operation unit 108 may be referred to as a main body side. In the description that follows, an example in which an image signal is transmitted from the main body side to the display side is taken. Naturally, the technology described below is not limited to the case of example.

As shown in FIG. 1, the liquid crystal unit 104 is provided in the display unit 102. Then, an image signal transmitted via the parallel signal line 112 is displayed in the liquid crystal unit 104. The connection unit 106 is a member to connect the display unit 102 and the operation unit 108. The connecting member forming the connection unit 106 has, for example, a structure to allow the display unit 102 to rotate in a Z-Y plane by 180 degrees. The connecting member also has a structure so that the display unit 102 is formed to be rotatable in an X-Y plane and the mobile terminal 100 can be folded. Incidentally, the connecting member may have a structure to allow the display unit 102 to move in a free direction.

The baseband processor 110 is an arithmetic processing unit that provides an execution function of communication control and applications of the mobile terminal 100. A parallel signal output from the baseband processor 110 is transmitted to the liquid crystal unit 104 of the display unit 102 through the parallel signal line 112. The parallel signal line 112 has a large number of signal lines wired therein. In the case of a mobile phone, for example, the number n of signal lines is about 50. The transmission speed of an image signal is about 200 Mbps when the resolution of the liquid crystal unit 104 is QVGA. The parallel signal line 112 is wired to pass through the connection unit 106.

That is, the connection unit 106 has a large number of signal lines forming the parallel signal line 112 therein. If the movable range of the connection unit 106 is extended as described above, the possibility of the parallel signal line 112 being damaged by movement thereof increases. As a result, reliability of the parallel signal line 112 will decrease. If, on the other hand, an attempt is made to maintain reliability of the parallel signal line 112, the movable range of the connection unit 106 will be significantly limited. For these reasons, the serial transmission method is frequently adopted for the mobile terminal 100 for the purpose of making flexibility of the movable member forming the connection unit 106 consistent with reliability of the parallel signal line 112. Also in terms of electromagnetic noise (EMI), serialization of transmission line has been promoted.

(Serial Transmission Method)

Figure 2:
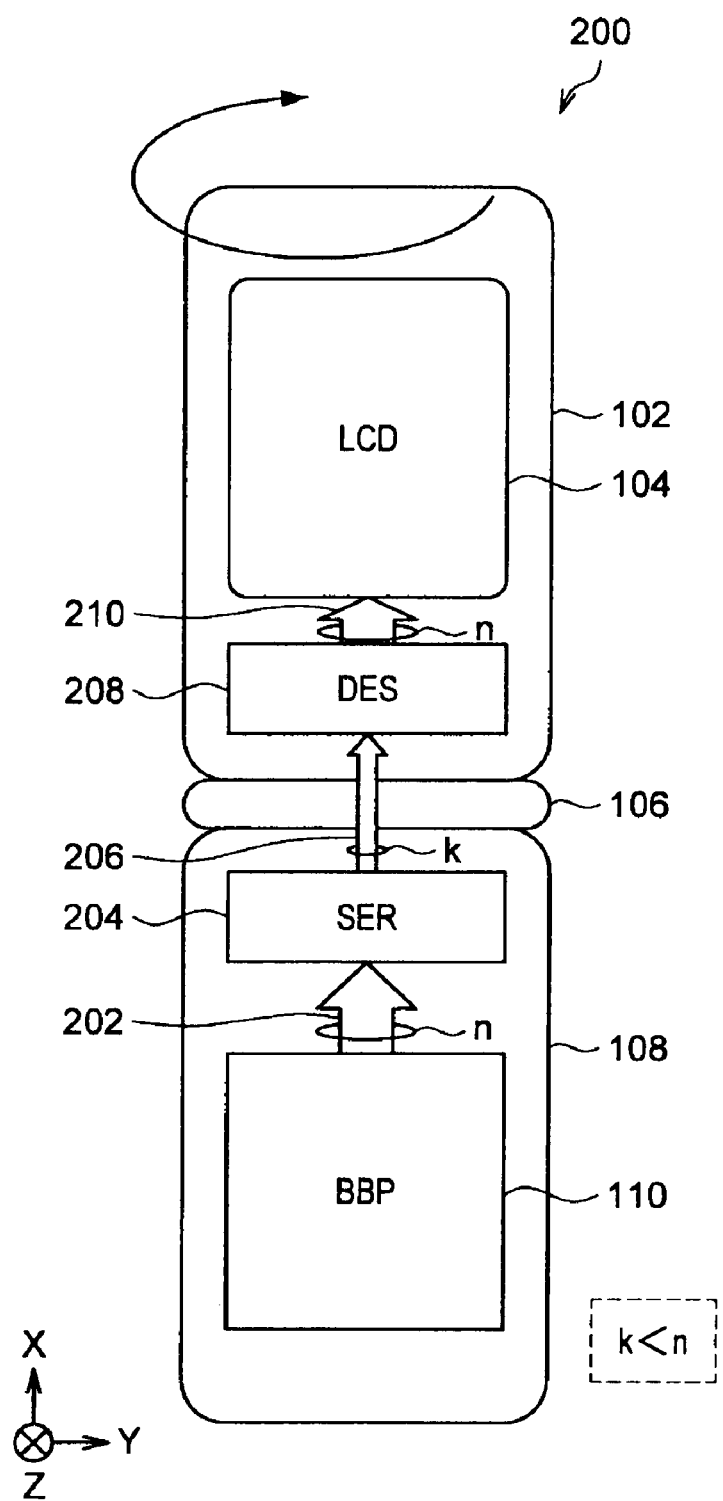
FIG. 2 is an explanatory view showing an example of a configuration of the mobile terminal.

Thus, a configuration example of a mobile terminal 200 in which the serial transmission method is adopted will be briefly described with reference to FIG. 2. FIG. 2 is an explanatory view showing a configuration example of the mobile terminal 200 in which the serial transmission method is adopted. In FIG. 2, a mobile phone is schematically illustrated as an example of the mobile terminal 200. However, the technology according to a description that follows is not limited to the mobile phone. The same reference numerals are attached to components having substantially the same function as those of the mobile terminal 100 in the parallel transmission method shown in FIG. 1 to omit a detailed description thereof.

As shown in FIG. 2, the mobile terminal 200 mainly includes the display unit 102, the liquid crystal unit 104 (LCD), the connection unit 106, the operation unit 108, the baseband processor 110 (BBP), parallel signal lines 202 and 210, a serializer 204, a serial signal line 206, and a deserializer 208.

In contrast to the mobile terminal 100, the mobile terminal 200 transmits an image signal by the serial transmission method through the serial signal line 206 wired in the connection unit 106. Thus, the operation unit 108 is provided with the serializer 204 for serializing parallel signals output from the baseband processor 110. On the other hand, the display unit 102 is provided with the deserializer 208 to parallelize a serial signal transmitted through the serial signal line 206.

The serializer 204 converts parallel signals output from the baseband processor 110 and input via the parallel signal line 202 into a serial signal. The serial signal converted by the serializer 204 is input into the deserializer 208 through the serial signal line 206. Then, the deserializer 208 restores the original parallel signals from the input serial signal, which are input into the liquid crystal unit 104 through the parallel signal line 210.

A data signal encoded, for example, by arbitrary mode is alone transmitted or a data signal and a clock signal are together transmitted through the serial signal line 206. The number k of wires in the serial signal line 206 is significantly smaller than the number n of wires in the parallel signal line 112 in the mobile terminal 1 in FIG. 1 ($k<<n$). For example, the number k of wires can be reduced to several wires. Thus, flexibility of the movable range of the connection unit 106 in which the serial signal line 206 is wired can be considered to be extremely larger than the connection unit 106 in which the parallel signal line 112 is wired. At the same time, reliability of the serial signal line 206 can be considered to be higher. Incidentally, a differential signal such as LVDS (Low Voltage Differential Signal) is used as a serial signal passing through the serial signal line 206.

(Overall Configuration of Mobile Terminal)

Figure 3:
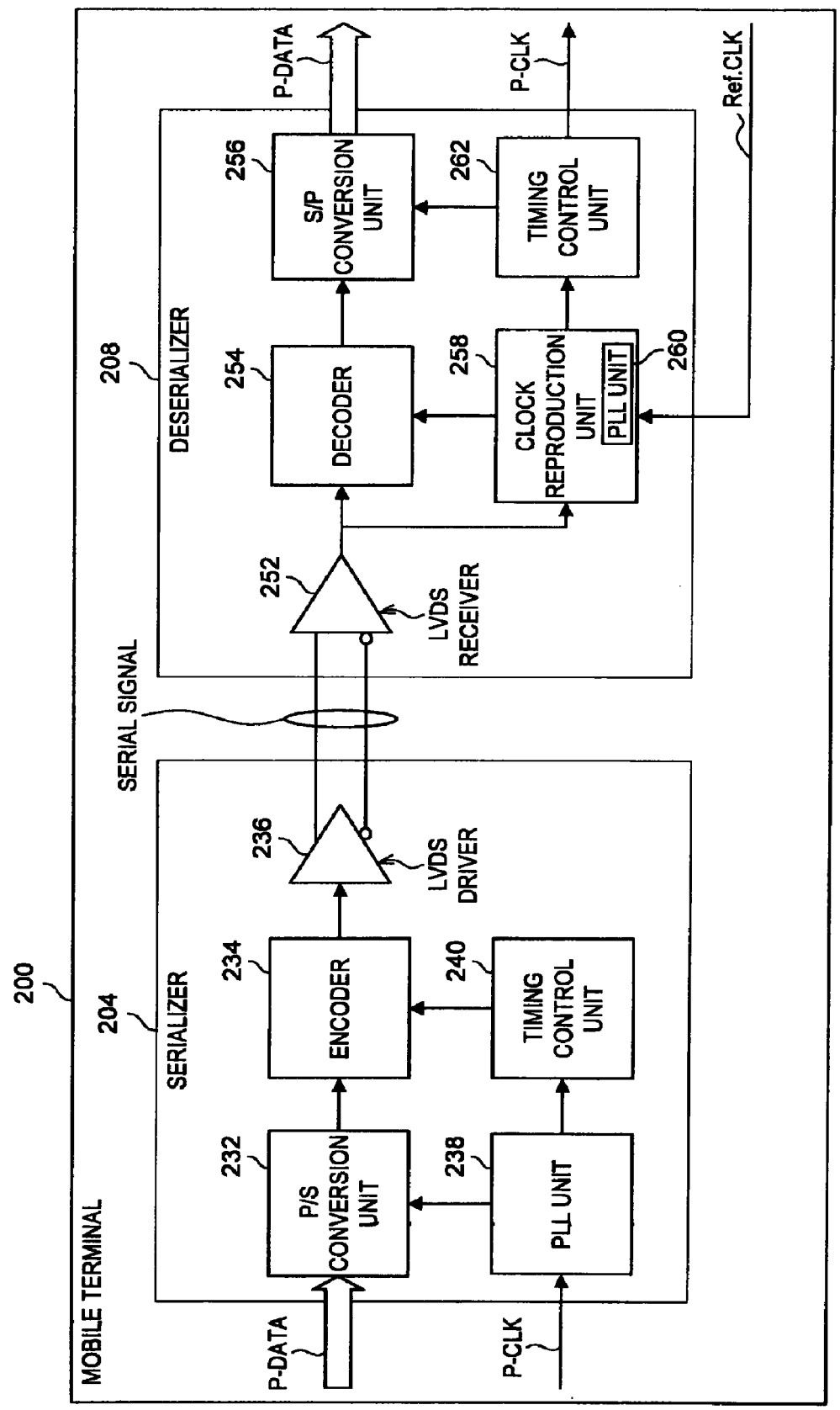
FIG. 3 is an explanatory view showing an example of a configuration of the mobile terminal according to serial transmission.

Here, the function configuration of the mobile terminal 200 in which the serial transmission method is adopted will be described with reference to FIG. 3. FIG. 3 is an explanatory view showing a function configuration example of the mobile terminal 200 in which the serial transmission method is adopted. However, FIG. 3 is an explanatory view illustrated by focusing on the function configuration of the serializer 204 and the deserializer 208 and omits an illustration of other components.

As shown in FIG. 3, the serializer 204 includes a P/S conversion unit 232, an encoder 234, an LVDS driver 236, a PLL unit 238, and a timing control unit 240.

As shown in FIG. 3, parallel signals (P-DATA) and a clock for parallel signals (P-CLK) are input from the baseband processor 110 into the serializer 204. The parallel signals input into the serializer 204 are converted into a serial signal by the P/S conversion unit 232. The serial signal converted by the P/S conversion unit 232 is input into the encoder 234. The encoder 234 encodes the serial signal, for example, by the Manchester coding mode and adds a header and the like to the serial signal and then inputs the serial signal into the LVDS driver 236. The LVDS driver 236 transmits the input serial signal to the deserializer 208 by the differential transmission method based on LVDS.

The clock for parallel signals input into the serializer 204, on the other hand, is input into the PLL unit 238. The PLL unit 238 generates a clock for serial signal from the clock for parallel signals and inputs the clock for serial signal into the P/S conversion unit 232 and the timing control unit 240. The timing control unit 240 controls transmission timing of a serial signal by the encoder 234 based on the input clock for serial signal.

As shown in FIG. 3, the deserializer 208 mainly includes an LVDS receiver 252, a decoder 254, an S/P conversion unit 256, a clock reproduction unit 258, a PLL unit 260, and a timing control unit 262.

As shown in FIG. 3, a serial signal is transmitted from the serializer 204 to the deserializer 208 by the differential transmission method based on LVDS. The serial signal is received by the LVDS receiver 252. The serial signal received by the LVDS receiver 252 is input into the decoder 254 and the clock reproduction unit 258. The decoder 254 detects a beginning portion of data by referencing the header of the input serial signal and inputs the serial signal into the S/P conversion unit 256. The S/P conversion unit 256 converts the input serial signal into parallel signals (P-DATA). The parallel signals converted by the S/P conversion unit 256 are output to the liquid crystal unit 104.

The clock reproduction unit 258, on the other hand, references a reference clock input from outside to reproduce a clock for parallel signals from the clock for serial signal using the built-in PLL unit 260. The clock for parallel signals reproduced by the clock reproduction unit 258 is input into the decoder 254 and the timing control unit 262. The timing control unit 262 controls reception timing based on the clock for parallel signals input from the clock reproduction unit 258. The clock for parallel signals (P-CLK) input into the timing control unit 262 is output to the liquid crystal unit 104.

Thus, parallel signals (P-DATA) and a clock for parallel signals (P-CLK) input from the baseband processor 110 into the serializer 204 are transmitted to the deserializer 208 after being converted into serial signals. Then, the input serial signals are restored to the original parallel signals and clock for parallel signals by the deserializer 208 before being output to the liquid crystal unit 104.

By transmitting parallel signals after being converted into a serial signal like the mobile terminal 200 described above, the transmission line thereof is serialized. As a result, the movable range of a portion in which the serial signal line is arranged is extended, improving flexibility concerning arrangement of the display unit 102. Thus, for example, the mobile terminal 200 can be modified so that, when a TV program is viewed using the mobile terminal 200, the arrangement of the display unit 102 is wide when viewed from a user. With such improved flexibility, usages of the mobile terminal 200 increase, creating, in addition to various functions as a communication terminal, various forms of use such as viewing of images and music.

Among such technology, the liquid crystal unit 104 of the mobile terminal 200 is becoming ever denser to enable a finer display so that more information is displayed with smaller letters and images. However, such smaller letters and images are more difficult to view for users. Thus, there is a user desire to output letters and images displayed in the liquid crystal unit 104 of the mobile terminal 200 to a large screen such as a TV set and display device installed outside. In response to such a desire, an output form like mobile terminal 300 shown in FIG. 4A has been proposed. The output form will be briefly described below.

Application Example 1

External Output System Using Electromagnetic Coupling

Figure 4A:
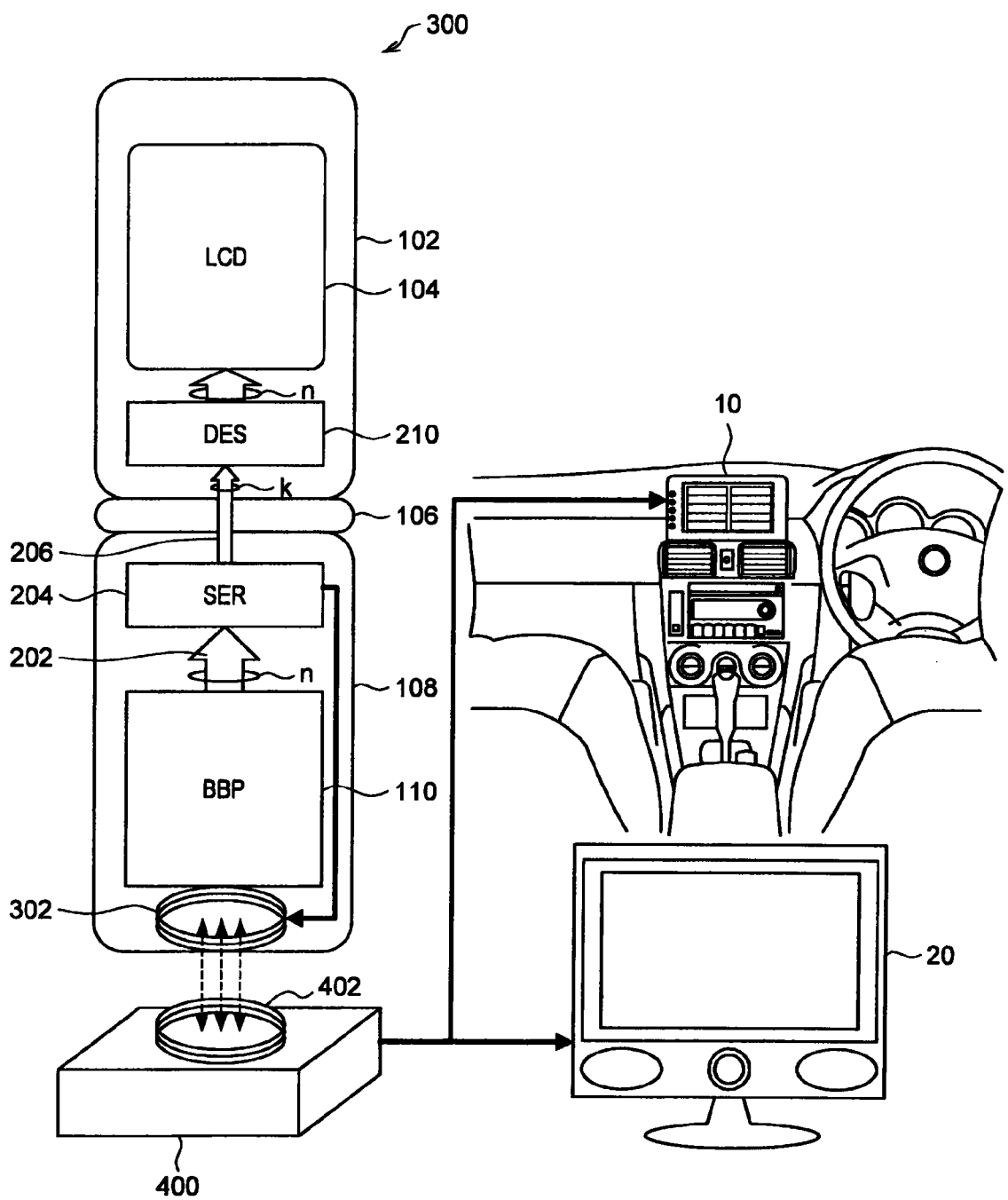
FIG. 4A is an explanatory view showing an example of a configuration of the mobile terminal.

First, FIG. 4A is referenced. FIG. 4A is an explanatory view showing a configuration example of the mobile terminal 300 capable of transmitting data such as images to an external output device using electromagnetic coupling. The external output device includes, for example, a car navigation system 10 and a TV set 20. In addition, a display device of a personal computer and a projector projecting images on a screen are also examples of the external output device.

A signal reader 400 as shown in FIG. 4A, for example, is used to transmit data such as images to such an external output device. The signal reader 400 is connected, for example, to the car navigation system 10 or the TV set 20, or contained in such a device. A signal is transmitted between the mobile terminal 300 and the signal reader 400 by using electromagnetic coupling. Thus, the mobile terminal 300 is provided with a coil 302. Further, the signal reader 400 is provided with a coil 402.

For example, an operation when an image signal is transmitted from the mobile terminal 300 to the TV set 20 will be considered. The mobile terminal 300 first generates parallel signals for parallel transmission of an image signal by the baseband processor 110. Then, the parallel signals are transmitted to the serializer 204 via the parallel signal line 202. The serializer 204 converts the transmitted parallel signals into a serial signal and transmits the serial signal to the serial signal line 206. At this point, a current signal corresponding to the serial signal is applied to the coil 302 so that an electromagnetic field is generated by the coil 302. Then, a current is generated in the coil 402 of the signal reader 400 by being induced by the electromagnetic field and the serial signal is demodulated by this current.

Thus, a serial signal corresponding to an image signal is transmitted between the mobile terminal 300 and the signal reader 400 using electromagnetic coupling. Naturally, the serial signal is encoded by a predetermined coding mode and modulated by a predetermined modulation method such as ASK (Amplitude Shift Keying) before being transmitted. However, a signal encoded by the NRZ coding mode contains a DC component and thus is not appropriate for transmission using electromagnetic coupling. Thus, the Manchester coding mode or the like in which a signal encoded thereby does not contain any DC component is used for transmission using electromagnetic coupling.

In the case of the example shown in FIG. 4A, a serial signal is encoded by the serializer 204 according to the Manchester coding mode and transmitted using electromagnetic coupling. In this case, the signal reader 400 naturally supports demodulation according to the Manchester coding mode. Therefore, after receiving the encoded signal, the signal reader 400 demodulates the signal into a serial signal and then, converts the serial signal into parallel signals, which are output to the TV set 20 or the like. When the Manchester code is used, "1" is transmitted as "10" and "0" as "01" and thus, compared with a system in which "1" and "0" are simply transmitted as they are, two times the transmission speed is necessary. However, Manchester code contains no DC component and is easy to extract a clock from and thus, is appropriate for signal transmission using electromagnetic coupling.

Figure 4B:
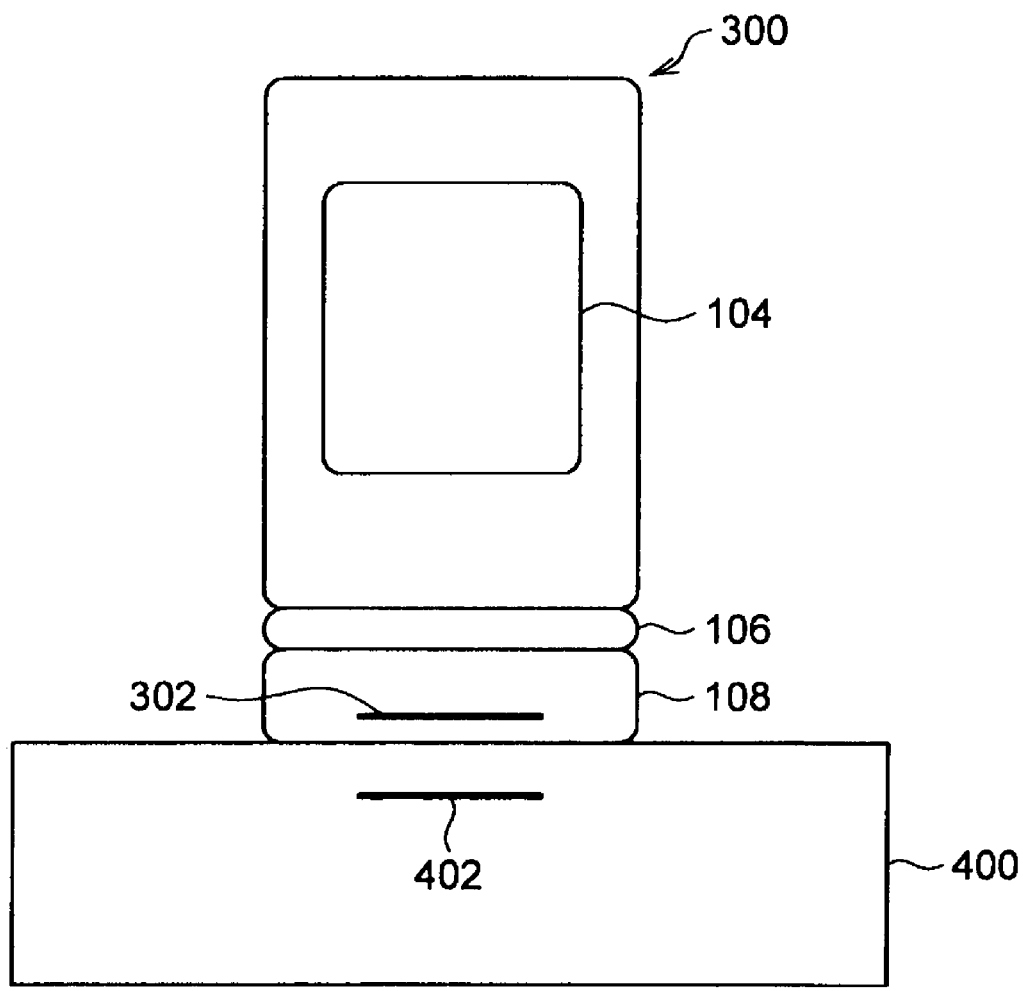
FIG. 4B is an explanatory view showing a contact state between the mobile terminal and a signal reader.

Incidentally, when the mobile terminal 300 and the signal reader 400 are close to each other, as shown in FIG. 4B, signal transmission is realized. Such a form of communication may be called non-contact communication. In the example in FIG. 4B, the mobile terminal 300 is placed with the display unit 102 open, but the mobile terminal 300 may also be placed with the display unit 102 closed. Normally, when the display unit 102 of the mobile terminal 300 is closed, power to the liquid crystal unit 104 is frequently turned off, contributing to power saving. At this point, a mode is set in which data can be transmitted to external output even if the mobile terminal 300 is closed.

Figure 5:
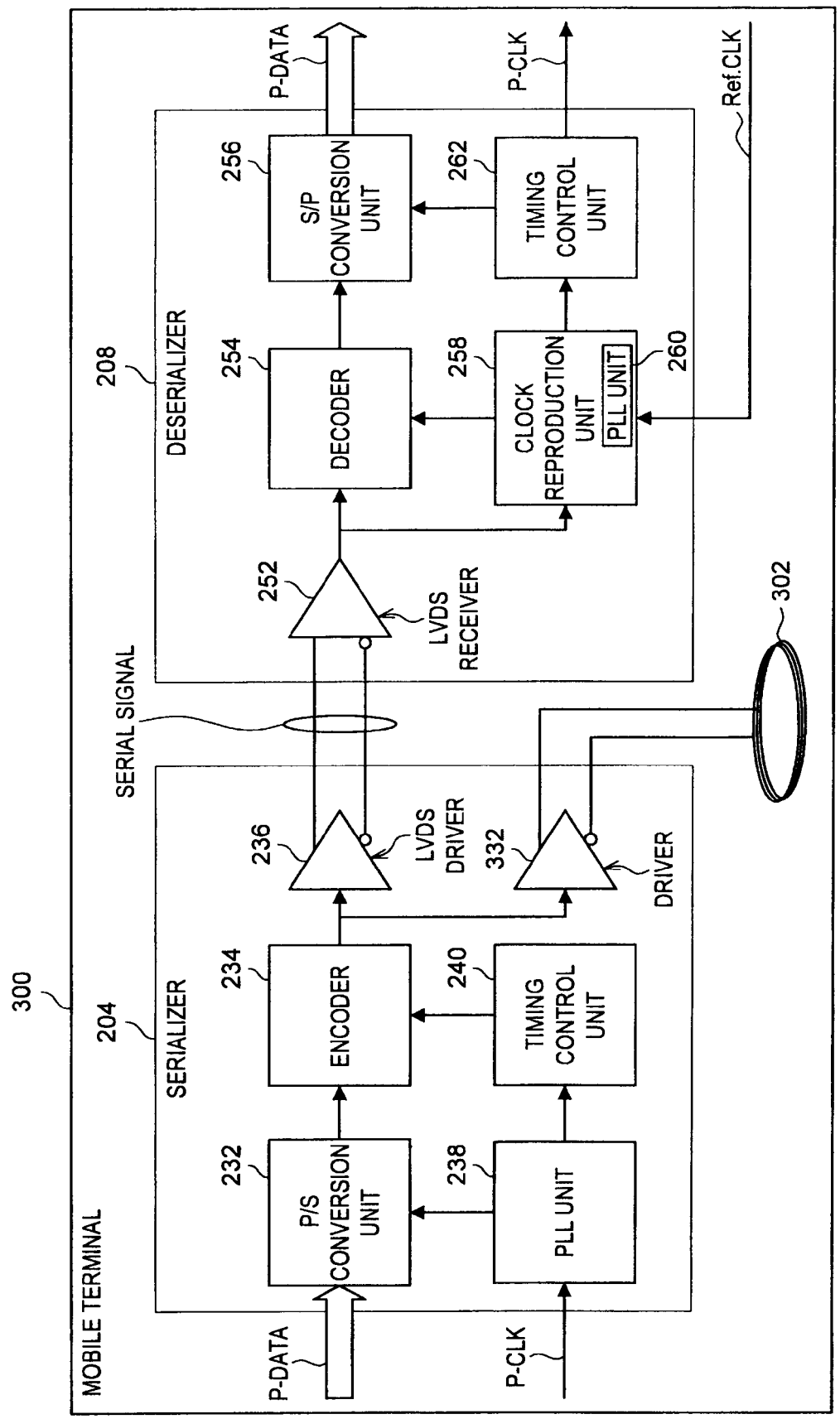
FIG. 5 is an explanatory view showing an example of a functional configuration of the mobile terminal according to serial transmission.

Here, the function configuration of the mobile terminal 300 will be briefly described with reference to FIG. 5. FIG. 5 is an explanatory view showing a function configuration example of the mobile terminal 300. However, FIG. 5 is an explanatory view illustrated by focusing on the function configuration of the serializer 204 and the deserializer 208 and omits an illustration of other components. Moreover, the same reference numerals are attached, among components of the mobile terminal 300, to components having substantially the same function configuration as those of the mobile terminals 200 to omit a detailed description thereof.

As shown in FIG. 5, the serializer 204 includes the P/S conversion unit 232, the encoder 234, the LVDS driver 236, the PLL unit 238, the timing control unit 240, and a driver 332.

As shown in FIG. 5, parallel signals (P-DATA) and a clock for parallel signals (P-CLK) are input from the baseband processor 110 into the serializer 204. The parallel signals input into the serializer 204 are converted into a serial signal by the P/S conversion unit 232. The serial signal converted by the P/S conversion unit 232 is input into the encoder 234. The encoder 234 adds a header and the like to the serial signal and encodes the serial signal by the Manchester coding mode and then, inputs the serial signal into the LVDS driver 236 and the driver 332. The LVDS driver 236 transmits the input serial signal to the deserializer 208 by the differential transmission method based on LVDS. The driver 332, on the other hand, transmits the input serial signal to the signal reader 400 using electromagnetic coupling by the coil 302.

The clock for parallel signals input into the serializer 204, on the other hand, is input into the PLL unit 238. The PLL unit 238 generates a clock for serial signal from the clock for parallel signals and inputs the clock for serial signal into the P/S conversion unit 232 and the timing control unit 240. The timing control unit 240 controls transmission timing of a serial signal by the encoder 234 based on the input clock for serial signal.

As shown in FIG. 5, the deserializer 208 mainly includes the LVDS receiver 252, the decoder 254, the S/P conversion unit 256, the clock reproduction unit 258, the PLL unit 260, and the timing control unit 262.

As shown in FIG. 5, a serial signal is transmitted from the serializer 204 to the deserializer 208 by the differential transmission method based on LVDS. The serial signal is received by the LVDS receiver 252. The serial signal received by the LVDS receiver 252 is input into the decoder 254 and the clock reproduction unit 258. The decoder 254 detects a beginning portion of data by referencing the header of the input serial signal and decodes the serial signal encoded by the Manchester coding mode and then, inputs the serial signal into the S/P conversion unit 256. The S/P conversion unit 256 converts the input serial signal into parallel signals (P-DATA). The parallel signals converted by the S/P conversion unit 256 are output to the liquid crystal unit 104.

The clock reproduction unit 258, on the other hand, references a reference clock input from outside to reproduce a clock for parallel signals from the clock for serial signal using the built-in PLL unit 260. The clock for parallel signals reproduced by the clock reproduction unit 258 is input into the decoder 254 and the timing control unit 262. The timing control unit 262 controls reception timing based on the clock for parallel signals input from the clock reproduction unit 258. The clock for parallel signals (P-CLK) input into the timing control unit 262 is output to the liquid crystal unit 104.

Thus, parallel signals (P-DATA) and a clock for parallel signals (P-CLK) input from the baseband processor 110 into the serializer 204 are transmitted to the deserializer 208 after being converted into serial signals. Then, the input serial signals are restored to the original parallel signals and clock for parallel signals by the deserializer 208 before being output to the liquid crystal unit 104.

Figure 6:
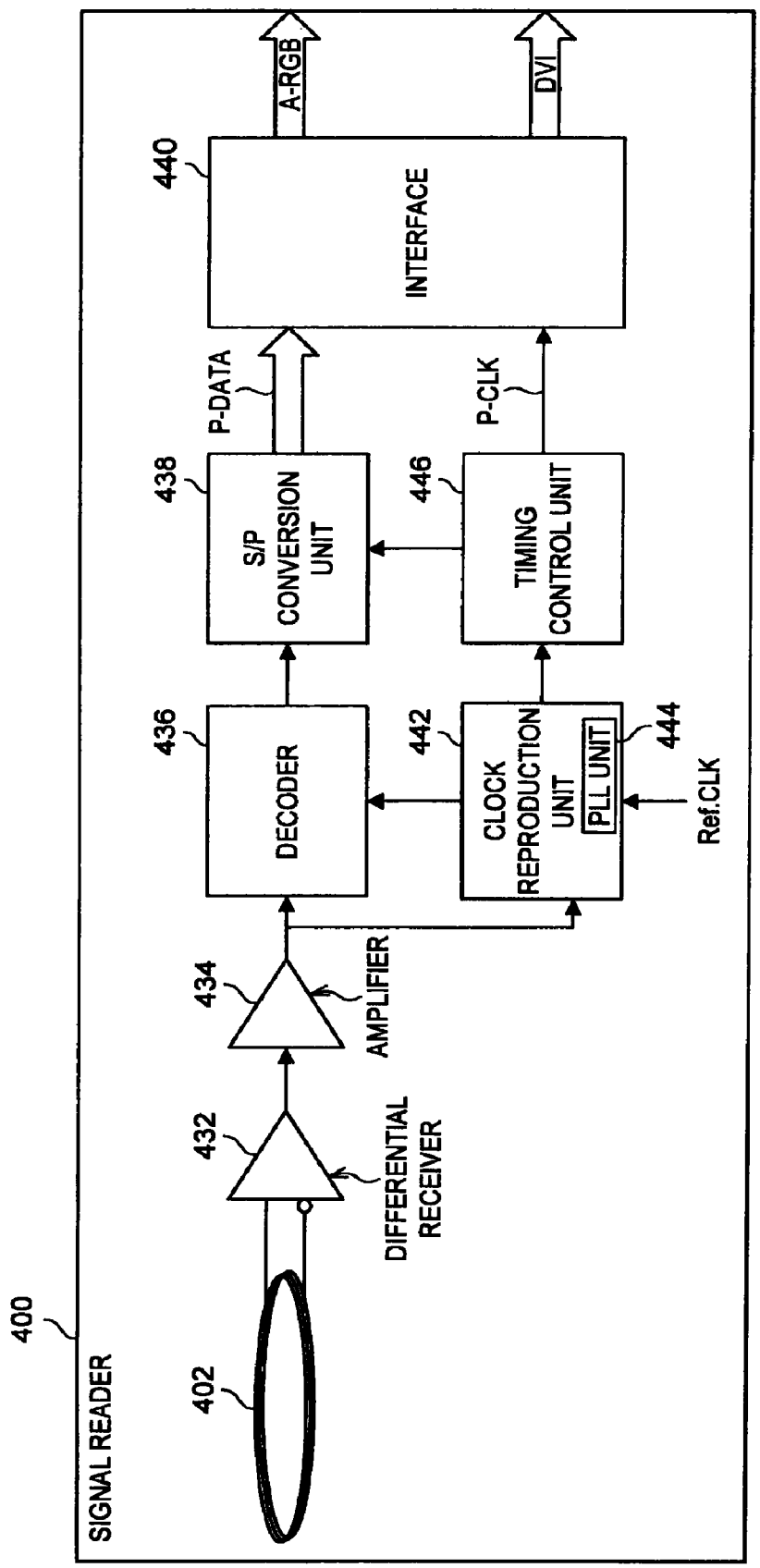
FIG. 6 is an explanatory view showing an example of a functional configuration of the signal reader according to serial transmission.

Next, the function configuration of the signal reader 400 will be briefly described with reference to FIG. 6. FIG. 6 is an explanatory view showing a function configuration example of the signal reader 400.

As shown in FIG. 6, the signal reader 400 mainly includes the coil 402, a differential receiver 432, an amplifier 434, a decoder 436, an S/P conversion unit 438, an interface 440, a clock reproduction unit 442, a PLL unit 444, and a timing control unit 446.

As described above, a serial signal is transmitted from the mobile terminals 300 to the signal reader 400 using electromagnetic coupling. The serial signal is received by the differential receiver 432 using the coil 402. The differential receiver 432 inputs the received serial signal into the amplifier 434. The amplifier 434 is provided to amplify the signal level of the serial signal lowered by signal transmission using electromagnetic coupling. The serial signal amplified by the amplifier 434 is input into the decoder 436 and the clock reproduction unit 442.

The decoder 436 detects the beginning portion of data by referencing the header of the input serial signal and decodes the serial signal encoded by the Manchester coding mode and then, inputs the serial signal into the S/P conversion unit 438. The S/P conversion unit 438 converts the input serial signal into parallel signals (P-DATA). The parallel signals converted by the S/P conversion unit 438 are input into the interface 440.

The clock reproduction unit 442, on the other hand, references a reference clock input from outside to reproduce a clock for parallel signals from the clock for serial signal using the built-in PLL unit 444. The clock for parallel signals reproduced by the clock reproduction unit 442 is input into the decoder 436 and the timing control unit 446. The timing control unit 446 controls reception timing based on the clock for parallel signals input from the clock reproduction unit 442. The clock for parallel signals (P-CLK) input into the timing control unit 446 is input into the interface 440.

The interface 440 converts and outputs the input parallel signals and clock for parallel signals into signals compatible with an external output device. For example, the interface 440 converts the input parallel signals into an analog RGB signal or DVI signal (Digital Visual Interface signal) and outputs the signal to the car navigation system 10, the TV set 20 or the like.

In the foregoing, the function configurations of the mobile terminal 300 and the signal reader 400 have been described. Thanks to such functions, the user can easily output an image and the like to an external display device by simply placing the mobile terminal 300 on the signal reader 400. Thus, an image and the like from the mobile terminal 300 can be output to a large screen. As a result, in addition to using the mobile terminal 300 as merely a personal communication device or the like, for example, the mobile terminal 300 can be caused to function as a TV phone used by a large number of people.
(General Manchester Code)

Figure 7:
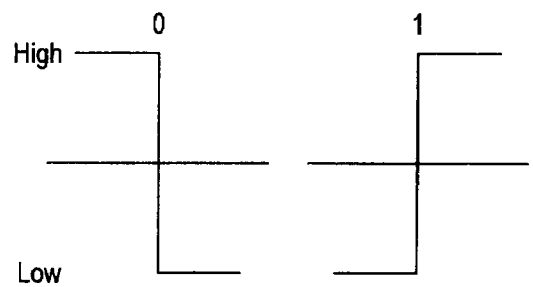
FIG. 7 is an explanatory view showing a general Manchester code.
Figure 8:
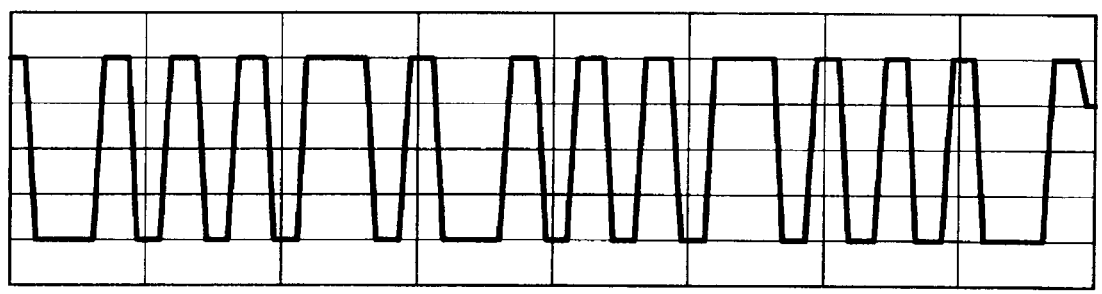
FIG. 8 is an explanatory view showing the general Manchester code.

Subsequently, the general Manchester code will be described with reference to FIG. 7 to FIG. 9. In the Manchester code, as shown in FIG. 7, the bit value "0" is represented by a signal whose signal level transitions from the high level to the low level and the bit value "1" is represented by a signal whose signal level transitions from the low level to the high level. Therefore, for example, a bit string "0, 1, 1, 1, 1, 0, 0, 1, 1, 1, 1, 0, 0, 0, 0, 1" is represented by a signal in Manchester code shown in FIG. 8.

Figure 9:
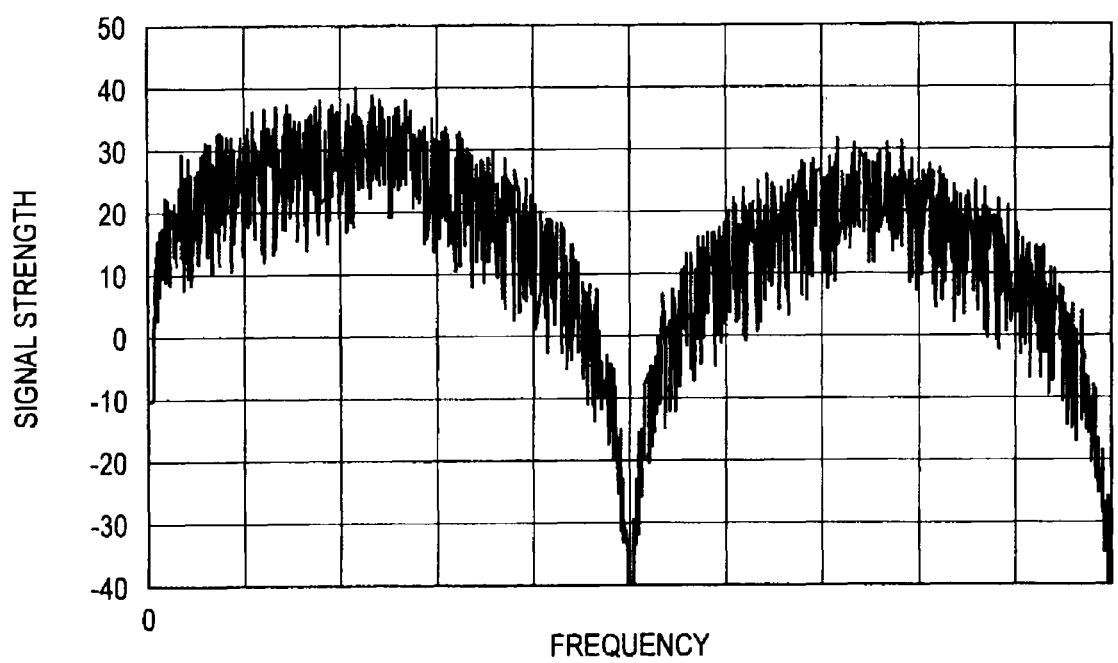
FIG. 9 is an explanatory view showing a frequency spectrum obtained by the Manchester code.

A frequency spectrum of a signal obtained by such Manchester code is shown in FIG. 9. As shown in FIG. 9, a signal obtained by such Manchester code has advantages such as containing no DC component, containing a clock component, and energy is not concentrated in a narrow frequency band.

However, as described above, data transmitted as a serial signal increases, for example, with increasing high-definition video. Thus, with such circumstances being focused on, a mobile terminal 500 according to the present embodiment has been made. According to the mobile terminal 500 in the present embodiment, the data transmission amount can be increased by the Manchester code while suppressing an occurrence of a DC component. The above mobile terminal 500 will be described below in detail.

(2) Detailed Description of the First Embodiment

Figure 10:
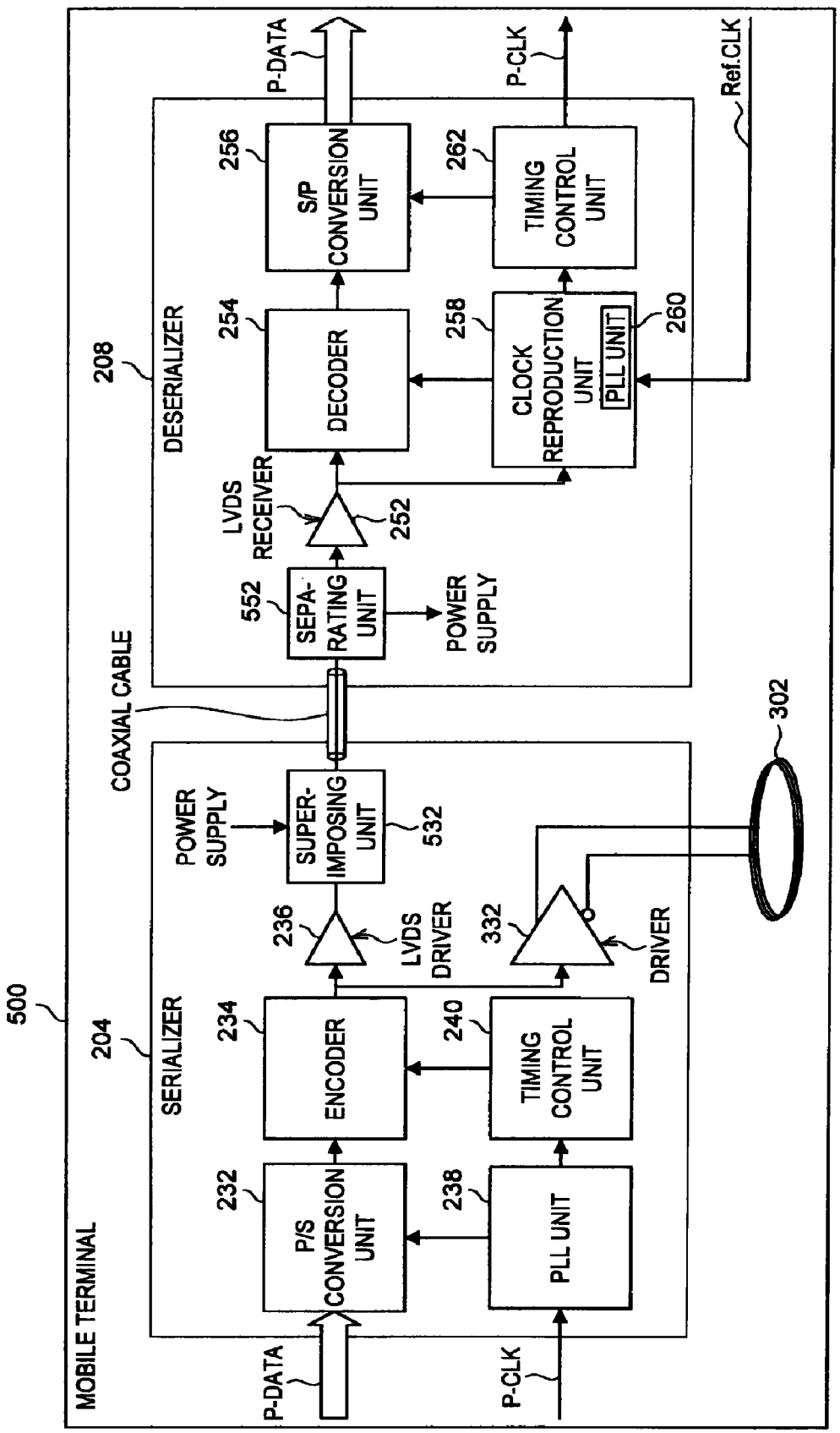
FIG. 10 is a functional block diagram showing the configuration of a mobile terminal according to a first embodiment of the present invention.

FIG. 10 is a functional block diagram showing the configuration of the mobile terminal 500 (signal processing system) according to the first embodiment of the present invention. The same reference numerals are attached to components of the mobile terminal 500 having substantially the same function/configuration as those in the mobile terminal 300 below to omit a detailed description thereof.
(Serializer)

As shown in FIG. 10, the serializer 204 (signal processing apparatus) includes the P/S conversion unit 232, the encoder 234 (generation unit), the LVDS driver 236, the PLL unit 238, the timing control unit 240, the driver 332, and a superimposing unit 532. The superimposing unit 532 is an example of a signal superimposing unit.

As shown in FIG. 10, parallel signals (P-DATA) and a clock for parallel signals (P-CLK) are input from the baseband processor 110 into the serializer 204. The parallel signals input into the serializer 204 are converted into a serial signal by the P/S conversion unit 232. The serial signal converted by the P/S conversion unit 232 is input into the encoder 234. The encoder 234 adds a header and the like to the serial signal and encodes the serial signal by a method without (or with a small amount of) a direct-current component such as the Manchester coding mode and then, inputs the serial signal into the LVDS driver 236 and the driver 332.

The LVDS driver 236 converts the input serial signal into an LVDS and then inputs the LVDS into the superimposing unit 532. The superimposing unit 532 transmits the signal input from the LVDS driver 236 to the deserializer 208 by superimposing the signal on the power supply line. For example, the superimposing unit 532 couples the signal by a capacitor and the power supply by a choke coil. In the power supply line, a coaxial cable, for example, is used as a transmission line. The power supply line is a line provided to supply power from the operation unit 108 to the display unit 102. The driver 332, on the other hand, transmits the input serial signal to the signal reader 400 using electromagnetic coupling to the coil 302.

Incidentally, the clock for parallel signals input into the serializer 204 is input into the PLL unit 238. The PLL unit 238 generates a clock for serial signal from the clock for parallel signals and inputs the clock for serial signal into the P/S conversion unit 232 and the timing control unit 240. The timing control unit 240 controls transmission timing of a serial signal by the encoder 234 based on a clock for serial signal being input (hereinafter, referred to simply as a clock signal).

The serializer 204 described above can increase the data transmission amount to the deserializer by encoding of a serial signal by the encoder 234. Encoding of a serial signal (data signal) by the encoder 234 will be described below in detail with reference to FIG. 11 to FIG. 18.

Figure 11:
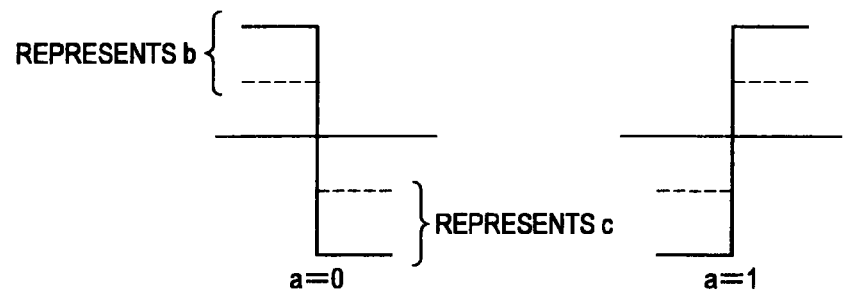
FIG. 11 is an explanatory view showing a signal waveform generated by an encoder.

FIG. 11 is an explanatory view showing a signal waveform generated by the encoder 234. As shown in FIG. 11, the encoder 234 can generate a plurality of different signal levels for each of the high level and low level and perform efficient encoding by selectively using the plurality of signal levels.

Figure 12:
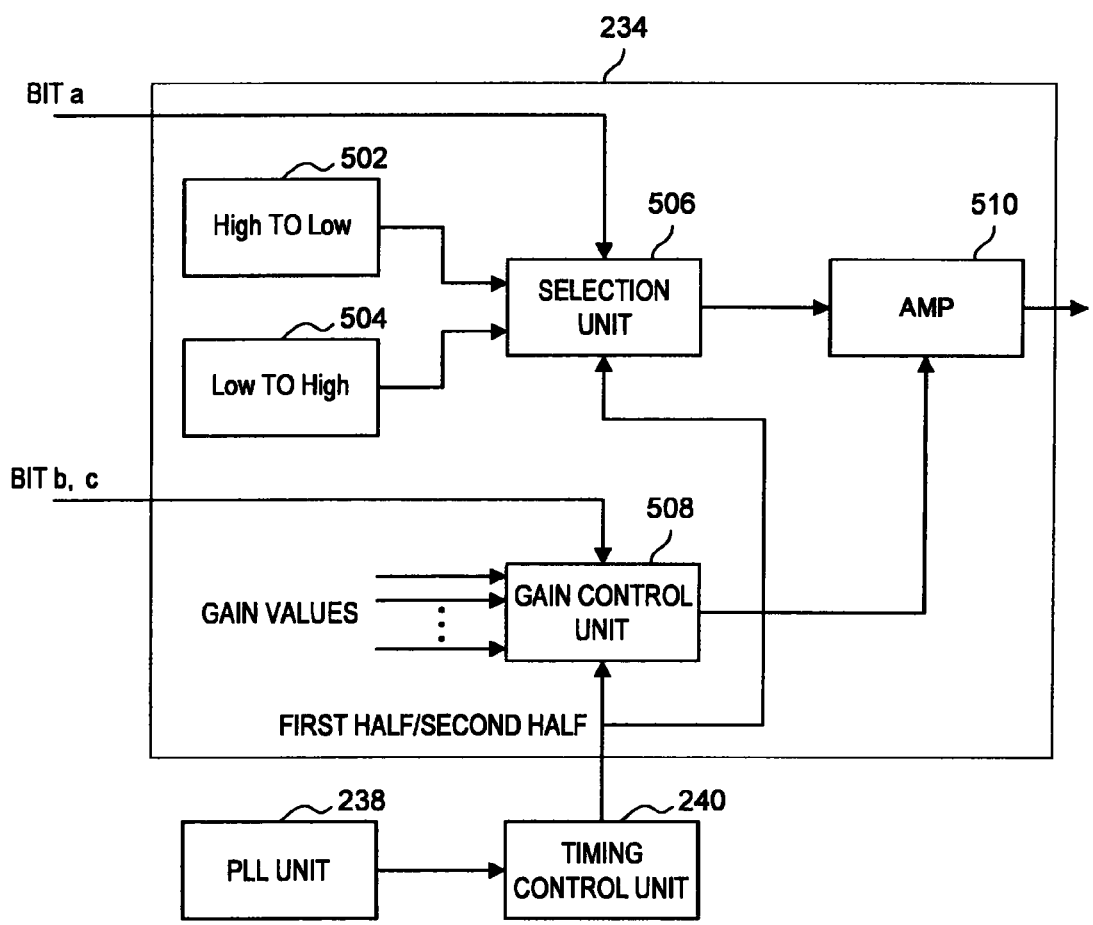
FIG. 12 is an explanatory view showing a configuration example of the encoder.

More specifically, the encoder 234 selects a signal waveform transitioning from the high level to the low level when some bit a is "0" and a signal waveform transitioning from the low level to the high level when the bit a is "1". Further, the encoder 234 selects a first half (pre-transition) amplitude level based on the size of a bit b and a second half (post-transition) amplitude level based on the size of a bit c. Then, the encoder 234 generates and outputs a signal having the selected signal waveform and amplitude level. FIG. 12 shows a detailed configuration example of the encoder 234 capable of realizing such a signal.

FIG. 12 is an explanatory view showing a configuration example of the encoder 234. As shown in FIG. 12, the encoder 234 includes a selection unit 506, a gain control unit 508, and an AMP 510.

The selection unit 506 selects, after the bit a being input, the signal waveform (waveform pattern) based on the value of the bit a. More specifically, the selection unit 506 selects a signal waveform (502) transitioning from the high level to the low level when the bit a is "0" and a signal waveform (504) transitioning from the low level to the high level when the bit a is "1". Then, the selection unit 506 outputs the selected signal waveform to the AMP 510.

The gain control unit 508 outputs, after the bit b and the bit c being input, a control signal to control the gain in the AMP 510 to the gain in accordance with the values of the bit b and the bit c. For example, if the value of the bit b is "1", the gain control unit 508 outputs a control signal to control the first half amplitude level to an amplitude level greater than that when the value of the bit b is "0". Similarly, if the value of the bit c is "1", the gain control unit 508 outputs a control signal to control the second half amplitude level to an amplitude level greater than that when the value of the bit c is "0".

The timing control unit 240 generates a signal indicating the first half or second half of a signal waveform based on a clock signal input from the PLL unit 238 and outputs the signal to the selection unit 506 and the gain control unit 508. The selection unit 506 and the gain control unit 508 can realize the above functions by grasping which of the first half and second half a signal waveform corresponds to based on a signal input from the timing control unit 240.

The AMP 510 amplifies and outputs a signal waveform input from the selection unit 506 based on a control signal input from the gain control unit 508. A concrete example of a signal output from the encoder 234 in this manner is shown in FIG. 13.

Figure 13:
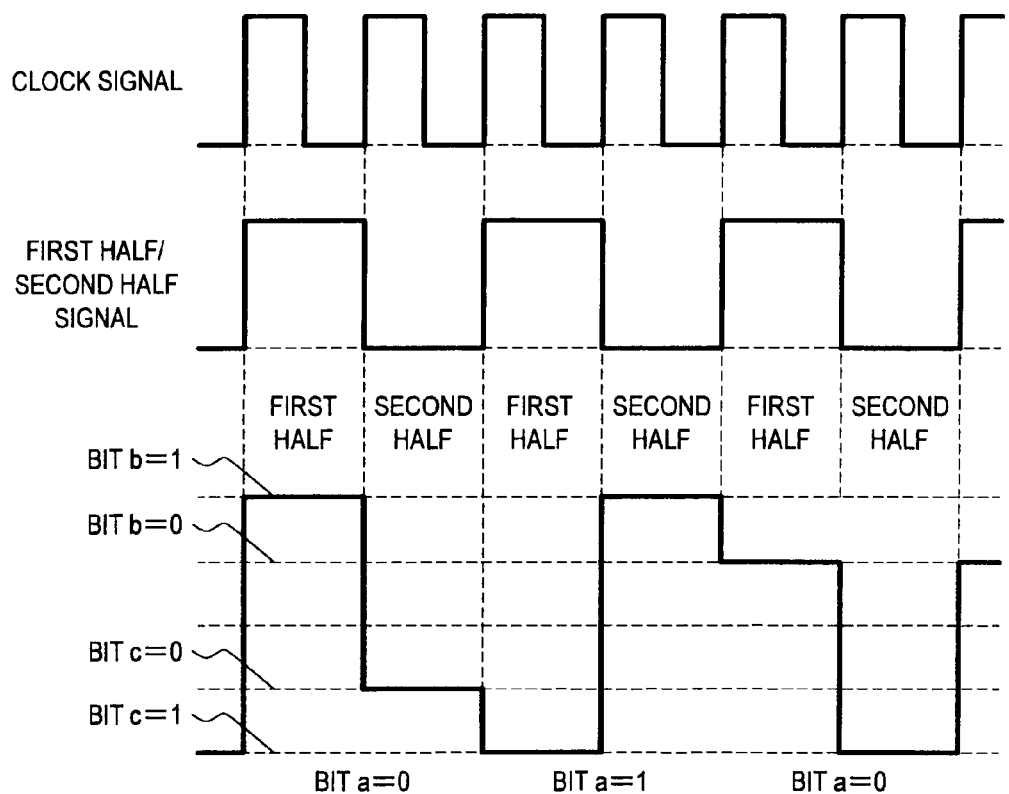
FIG. 13 is an explanatory view showing a concrete example of a signal output from the encoder.

FIG. 13 is an explanatory view showing a concrete example of a signal output from the encoder 234. As shown in FIG. 13, the timing control unit 240 generates a signal indicating the first half or second half (first half/second half signal) of a signal waveform in synchronization with a clock signal. In FIG. 13, the period in which the signal level is at a high level corresponds to the first half and that in which the signal level is at a low level corresponds to the second half.

FIG. 13 also shows an example in which "0" is first input as the bit a, "1" as the bit b, and "0" as the bit c. In this case, the selection unit 506 selects a signal waveform transitioning from the high level to the low level because the bit a is "0". The gain control unit 508 generates a control signal that controls the first half gain higher and the second half lower because the bit b is "1" and the bit c is "0". As a result, as shown in FIG. 13, a signal having a waveform transitioning from the high level to the low level with the first half amplitude level of "2" (high gain) and the second half amplitude level of "1" (low gain) is output from the AMP 510. FIG. 13 shows a signal output from the encoder 234 when hereafter "1" is input as the bit a, "1" as the bit b, and "1" as the bit c, and further "0" is input as the bit a, "0" as the bit b, and "1" as the bit c.

Figure 14:
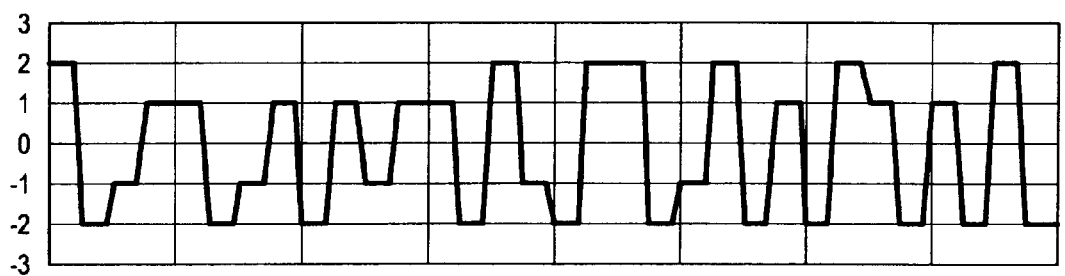
FIG. 14 is an explanatory view showing a more realistic signal waveform example output from the encoder.

FIG. 14 shows a more realistic signal waveform example output from the encoder 234. As shown in FIG. 14, the signal waveform in the first cycle changes from the high level to the low level and the first half amplitude level is "2" and the second half amplitude level is also "2" and therefore, the signal waveform represents the bit a "0", the bit b "1", and the bit c "1".

Figure 15:
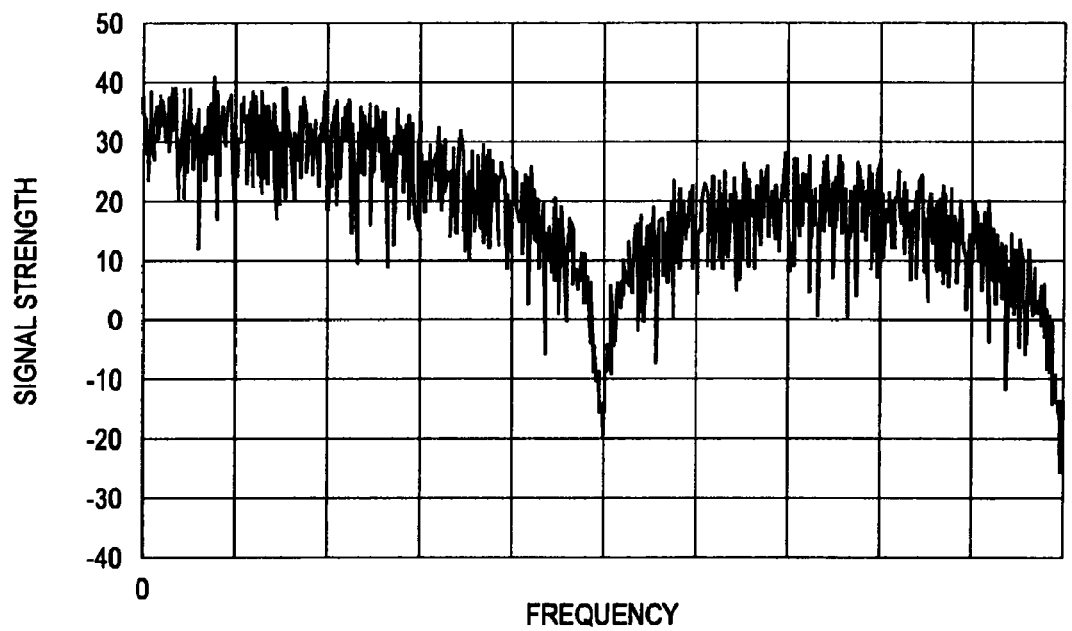
FIG. 15 is an explanatory view showing the frequency spectrum of a signal obtained by an NRZ coding mode.
Figure 16:
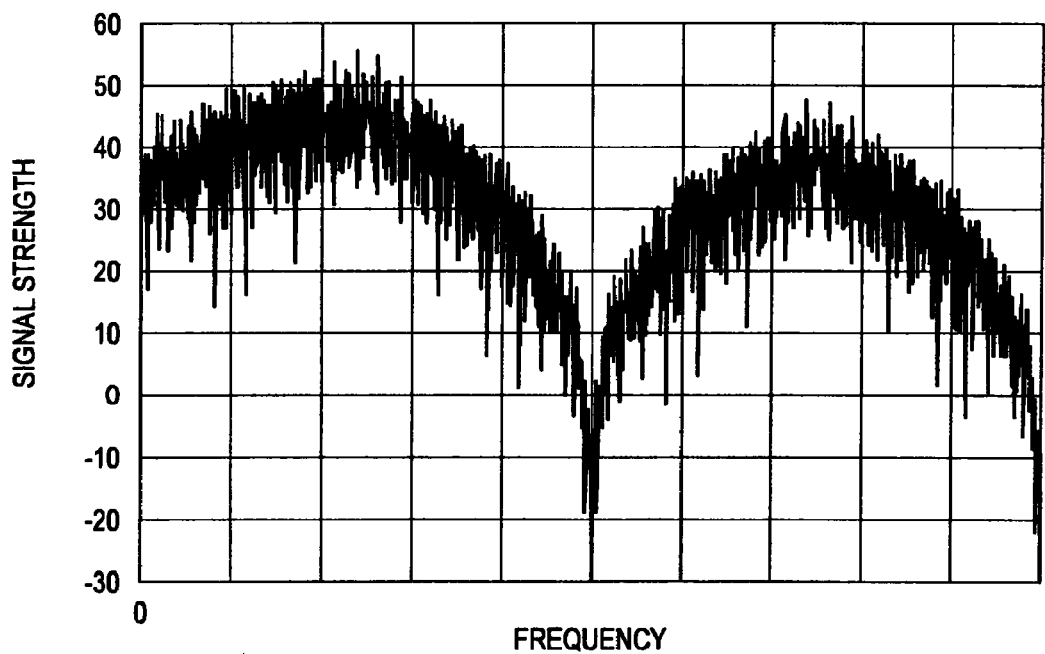
FIG. 16 is an explanatory view showing the frequency spectrum of a signal output by an encoder according to the first embodiment.
Figure 17:
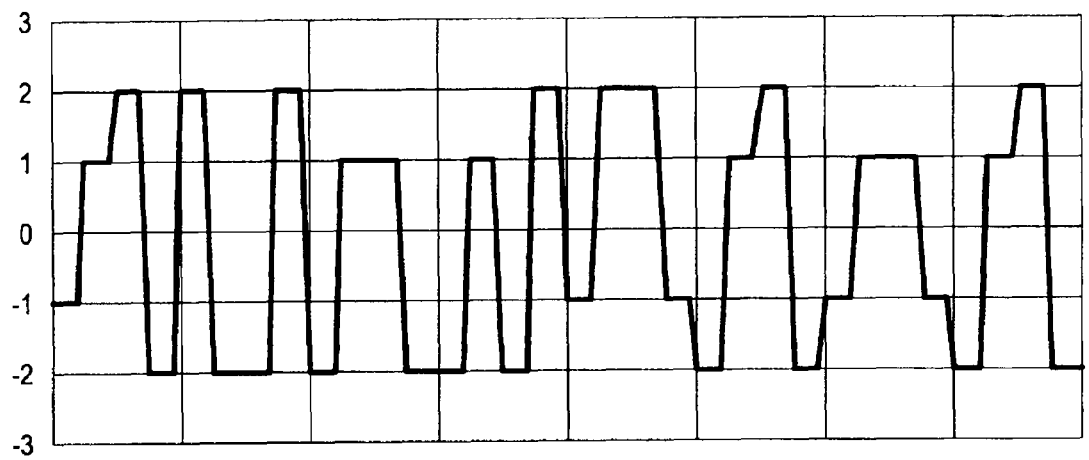
FIG. 17 is an explanatory view showing the waveform of the signal output by the encoder according to the first embodiment.
Figure 18:
FIG. 18 is an explanatory view showing the waveform of a signal obtained through a high-pass filter of the signal having the waveform shown in FIG. 17.

FIG. 15 shows the frequency spectrum of a signal obtained by the NRZ coding mode. As shown in FIG. 15, the NRZ coding mode is disadvantageous because the NRZ coding mode contains many DC components and therefore is significantly affected by variations in the DC offset value. In contrast, as shown in FIG. 16, the frequency spectrum of a signal output from the encoder 234 according to the present embodiment can confirm that DC components are reduced by the NRZ coding mode. Thus, while a deviation arises to some extent, as shown in FIG. 17 and FIG. 18, even if DC components in a signal output from the encoder 234 according to the present embodiment are cut using, for example, a high-pass filter, the signal waveform sufficient for decoding can be maintained. FIG. 17 shows the waveform of a signal output by the encoder 234 according to the present embodiment, and FIG. 18 shows the waveform of a signal obtained through a high-pass filter of the signal having the waveform shown in FIG. 17.

(Deserializer)

The serializer 204 has been described in detail with reference to FIG. 10 to FIG. 18. Subsequently, the deserializer 208 will be described in detail with reference to FIG. 10 and FIG. 19 to FIG. 23.

As shown in FIG. 10, the deserializer 208 mainly includes the LVDS receiver 252, the decoder 254, the S/P conversion unit 256, the clock reproduction unit 258, the PLL unit 260, the timing control unit 262, and a separating unit 552. The separating unit 552 is an example of a signal separating unit.

As shown in FIG. 10, a signal in which a power supply and a serial signal (input signal) are superimposed is transmitted to the deserializer 208 through a power supply line (coaxial cable). For example, the separating unit 552 extracts a serial signal by cutting a direct-current component by a capacitor and a power supply by cutting high-frequency components by a choke coil. The serial signal separated by the separating unit 552 is received by the LVDS receiver 252.

The serial signal received by the LVDS receiver 252 is input into the decoder 254 and the clock reproduction unit 258. The decoder 254 detects a beginning portion of data by referencing the header of the input serial signal and decodes the serial signal encoded by the Manchester coding mode or the like and then, inputs the serial signal into the S/P conversion unit 256. The S/P conversion unit 256 converts the input serial signal into parallel signals (P-DATA). The parallel signals converted by the S/P conversion unit 256 are output to the liquid crystal unit 104.

The clock reproduction unit 258, on the other hand, references a reference clock input from outside to reproduce a clock for parallel signals from the clock for serial signal using the built-in PLL unit 260. The clock for parallel signals reproduced by the clock reproduction unit 258 is input into the decoder 254 and the timing control unit 262. The timing control unit 262 controls reception timing based on the clock for parallel signals input from the clock reproduction unit 258. The clock for parallel signals (P-CLK) input into the timing control unit 262 is output to the liquid crystal unit 104.

The function of the decoder 254 that decodes a serial signal encoded by the coding mode described in "Serializer" above will be described with reference to FIG. 19 to FIG. 23.

Figure 19:
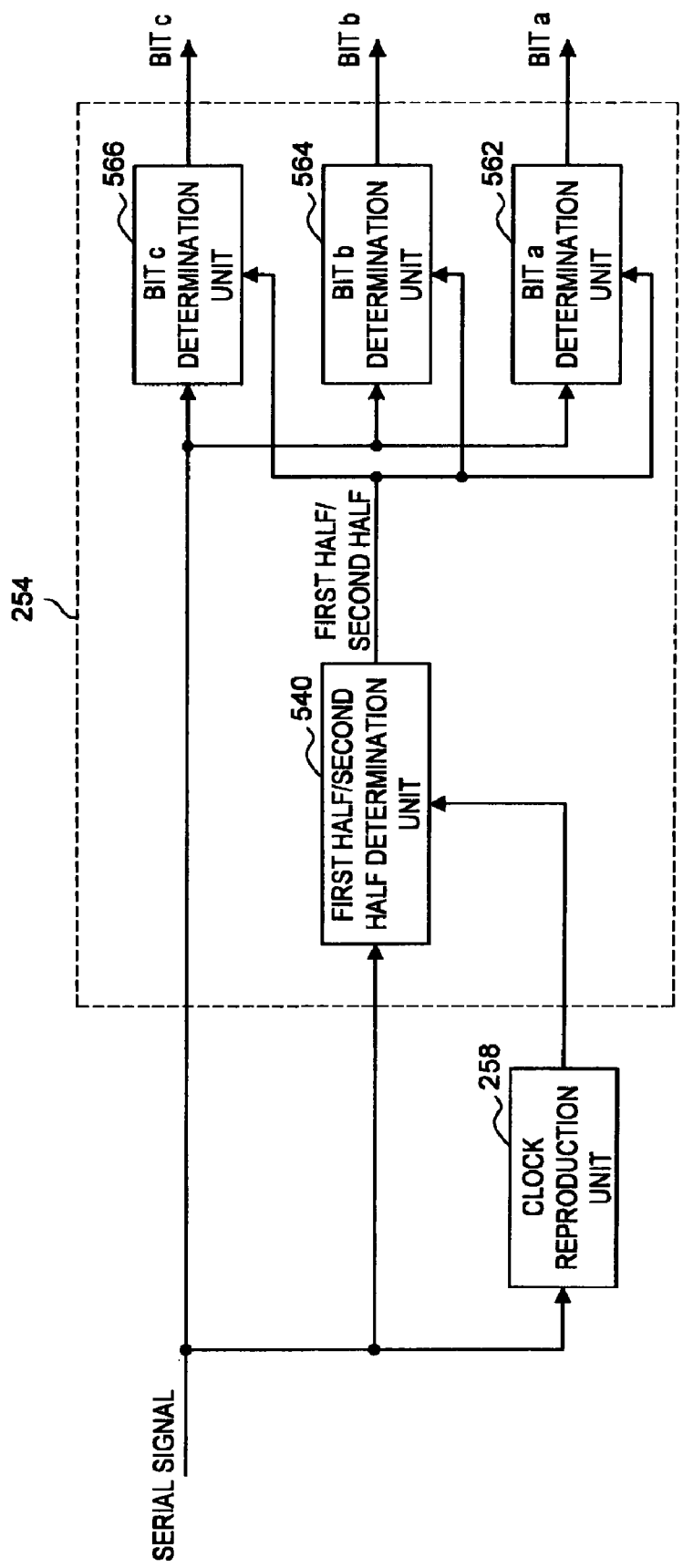
FIG. 19 is a functional block diagram showing the configuration of a decoder.

FIG. 19 is a functional block diagram showing the configuration of the decoder 254. As shown in FIG. 19, the decoder 254 includes a first half/second half determination unit 540, a bit a determination unit 562, a bit b determination unit 564, and a bit c determination unit 566.

The first half/second half determination unit 540 determines timing of a boundary of the first half and second half of each cycle from a signal pattern of a serial signal and to generate a first half/second half signal that indicates the first half or second half. A detailed configuration of the first half/second half determination unit 540 described above will be described with reference to FIG. 20 to FIG. 22.

Figure 20:
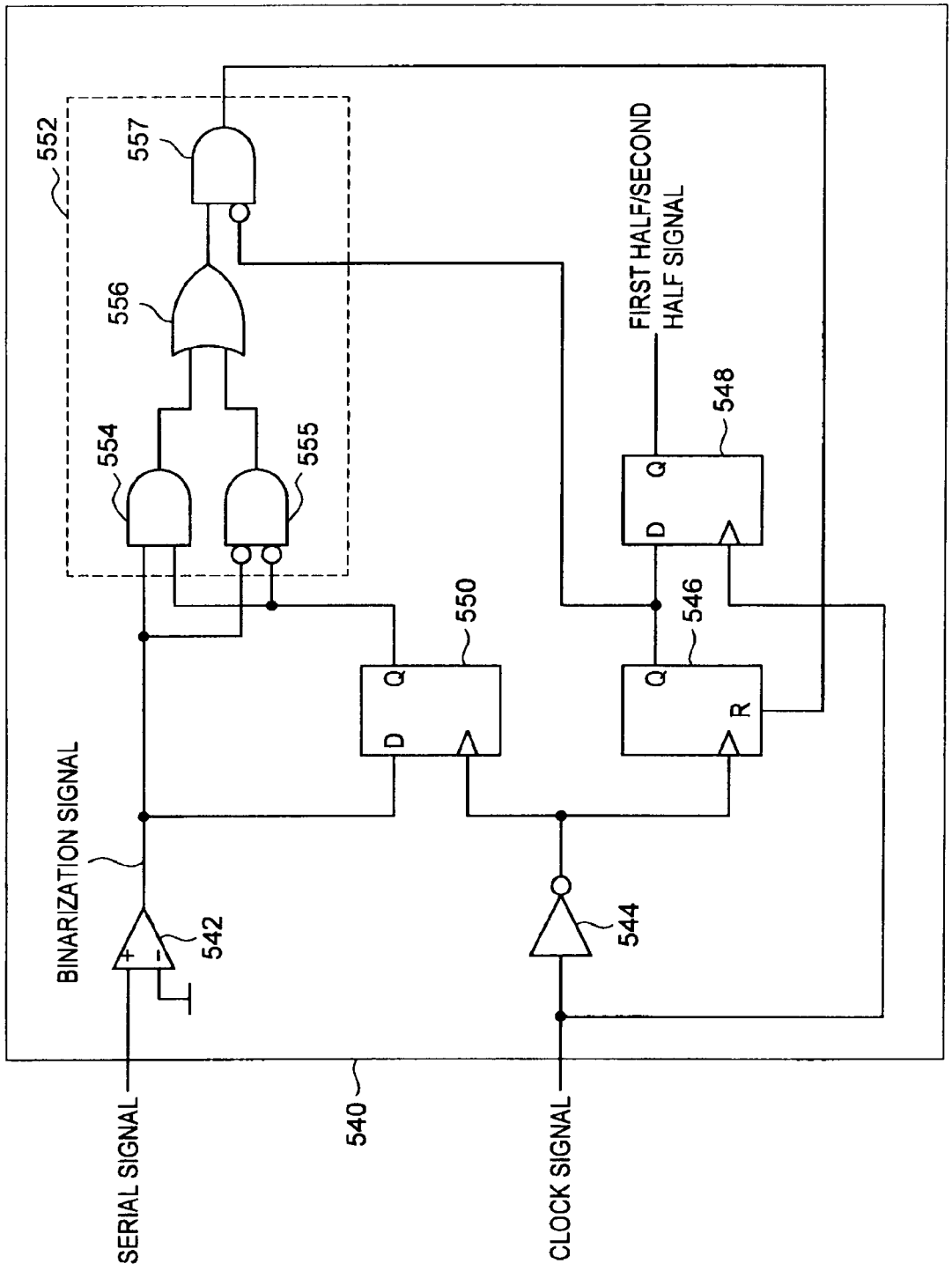
FIG. 20 is a functional block diagram showing the configuration of a first half/second half determination unit.

FIG. 20 is a functional block diagram showing the configuration of the first half/second half determination unit 540. As shown in FIG. 20, the first half/second half determination unit 540 includes a comparator 542, an inverting circuit 544, a 1-bit counter 546, a delay circuit 548, a delay circuit 550, and a logical circuit group 552.

The comparator 542 binarizes a serial signal by a first threshold and outputs a binarization signal. Here, the first threshold may be a level higher than a low level whose amplitude level is the lowest among a plurality of low levels and lower than a high level whose amplitude level is the lowest among a plurality of high levels. The inverting circuit 544 inverts the polarity of a clock signal. The 1-bit counter 546 outputs a signal whose polarity is inverted when a clock signal falls (when a clock signal whose polarity is inverted by the inverting circuit 544 rises). The delay circuit 548 generates a first half/second half signal by delaying a signal output from the 1-bit counter 546 by half a clock. A concrete example of a first half/second half signal generated in this manner will be described with reference to FIG. 21.

Figure 21:
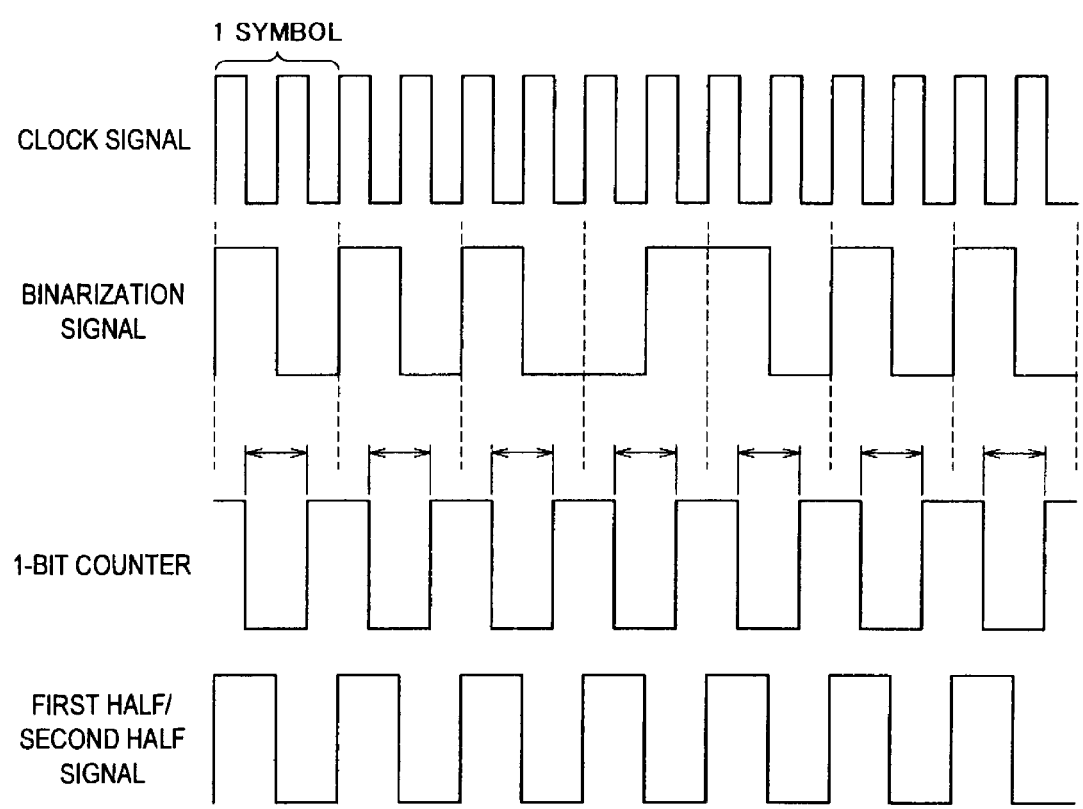
FIG. 21 is an explanatory view showing how a first half/second half signal is generated.

FIG. 21 is an explanatory view showing how a first half/second half signal is generated. As shown in FIG. 21, while the signal output from the 1-bit counter 546 is at a low level, it is desirable that the center of a symbol (cycle) in Manchester code is contained and the polarity of the binarization signal is inverted in the period. However, a case in which the 1-bit counter 546 is not exactly in synchronization with the binarization signal, that is, a case in which the polarity of the binarization signal is not inverted while the signal output from the 1-bit counter 546 is at a low level can be assumed. In preparation for such a case, the delay circuit 550 and the logical circuit group 552 are provided in the first half/second half determination unit 540.

The delay circuit 550 delays a binarization signal by a clock. The logical circuit group 552 includes a first arithmetic logic unit 554, a second arithmetic logic unit 555, a third arithmetic logic unit 556, and a fourth arithmetic logic unit 557, and determines whether or not the polarity of a binarization signal is inverted while the signal output from the 1-bit counter 546 is at a low level.

More specifically, when both a binarization signal and a binarization signal delayed by the delay circuit 550 are at a high level, the first arithmetic logic unit 554 outputs a high-level signal. When both a binarization signal and a binarization signal delayed by the delay circuit 550 are at a low level, the second arithmetic logic unit 555 outputs a high-level signal.

When at least one of signals output from the first arithmetic logic unit 554 and the second arithmetic logic unit 555 is at a high level, that is, the polarity of the binarization signal continues for two clocks, the third arithmetic logic unit 556 outputs a high-level signal.

When the signal output from the third arithmetic logic unit 556 is a high-level signal and the signal output from the 1-bit counter 546 is a low-level signal, the fourth arithmetic logic unit 557 outputs a high-level signal. That is, if the polarity of the binarization signal is not inverted while the signal output from the 1-bit counter 546 is at a low level, the fourth arithmetic logic unit 557 outputs a high-level signal. The signal output from the fourth arithmetic logic unit 557 is input into the 1-bit counter 546. When a high-level signal is input into the 1-bit counter 546 from the fourth arithmetic logic unit 557, the 1-bit counter 546 resets the operation timing of the counter. A concrete example of the operation timing of the 1-bit counter 546 being reset will be described with reference to FIG. 22.

Figure 22:
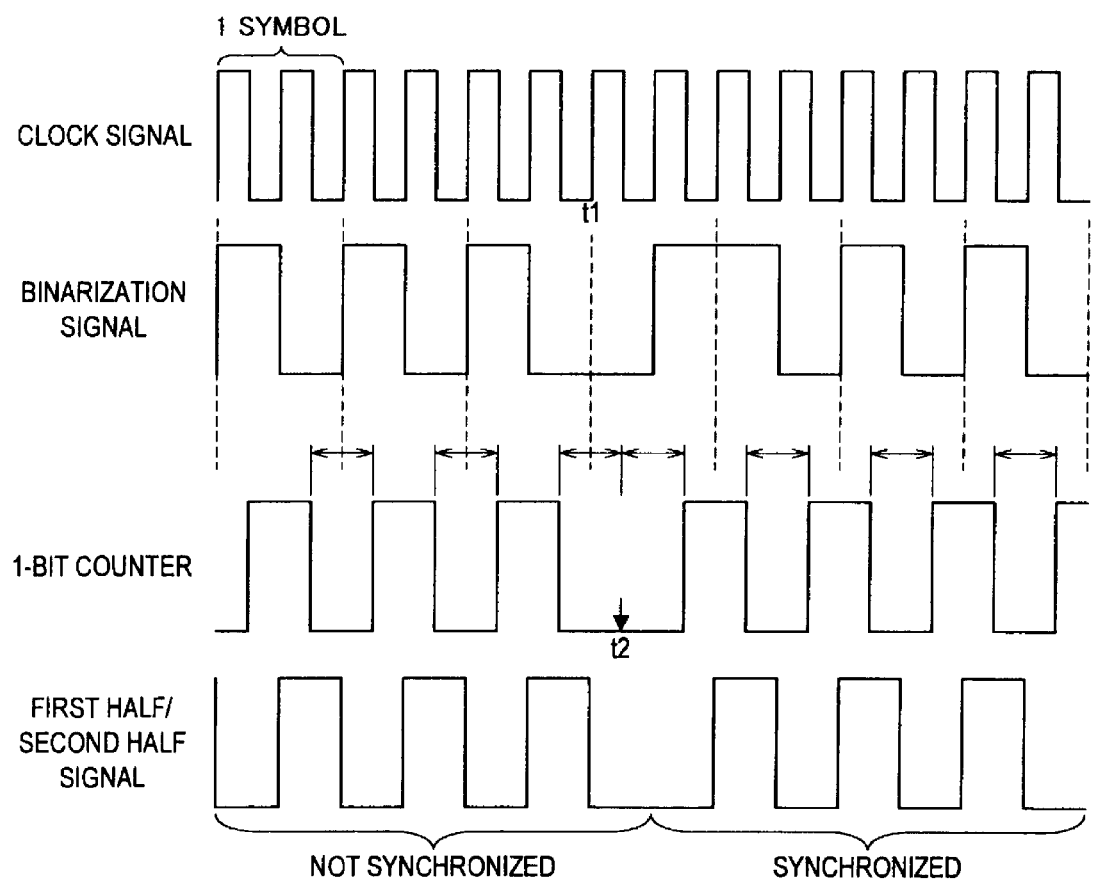
FIG. 22 is an explanatory view showing how operation timing of a 1-bit counter is reset.

FIG. 22 is an explanatory view showing how the operation timing of the 1-bit counter 546 is reset. When the 1-bit counter 546 is not exactly in synchronization with a binarization signal, as shown in FIG. 22, a case in which the polarity of the binarization signal is not inverted while the signal output from the 1-bit counter 546 is at a low level arises (timing t1). In this case, a high-level signal is input into the 1-bit counter 546 from the fourth arithmetic logic unit 557 and the 1-bit counter 546 resets the operation timing based on the signal (timing t2). Accordingly, even if the operation timing of the 1-bit counter 546 is not in synchronization with the binarization signal (serial signal), the operation timing can be corrected to the normal timing.

Here, the description returns to that of the decoder 254 with reference to FIG. 19. After a first half/second half signal being input from the first half/second half determination unit 540, the bit a determination unit 562 determines the value of the bit a based on whether the signal level of a serial signal in the first half of a symbol in which the first half/second half signal is at a high level is at a high level (positive) or at a low level (negative). That is, the bit a determination unit 562 functions as a first determination unit that determines that the value of the bit a is "0" for a signal waveform transitioning from the high level to the low level and "1" for a signal waveform transitioning from the low level to the high level. While a clock signal is actually input into the bit a determination unit 562, the bit b determination unit 564, and the bit c determination unit 566, arrows from the clock reproduction unit 258 to each determination unit are omitted from the standpoint of clarity of the drawing in FIG. 19.

After a first half/second half signal being input from the first half/second half determination unit 540, the bit b determination unit 564 determines the value of the bit b based on the amplitude level of a serial signal in the first half of a symbol in which the first half/second half signal is at a high level. That is, the bit b determination unit 564 functions as a second determination unit that determines that the value of the bit b is "1" if the signal level of a serial signal in the first half of a symbol is high and "0" if the signal level is low.

After a first half/second half signal being input from the first half/second half determination unit 540, the bit c determination unit 566 determines the value of the bit c based on the amplitude level of a serial signal in the second half of a symbol in which the first half/second half signal is at a low level. That is, the bit c determination unit 566 functions as a third determination unit that determines that the value of the bit c is "1" if the amplitude level of a serial signal in the second half of a symbol is high and "0" if the signal level is low.

Figure 23:
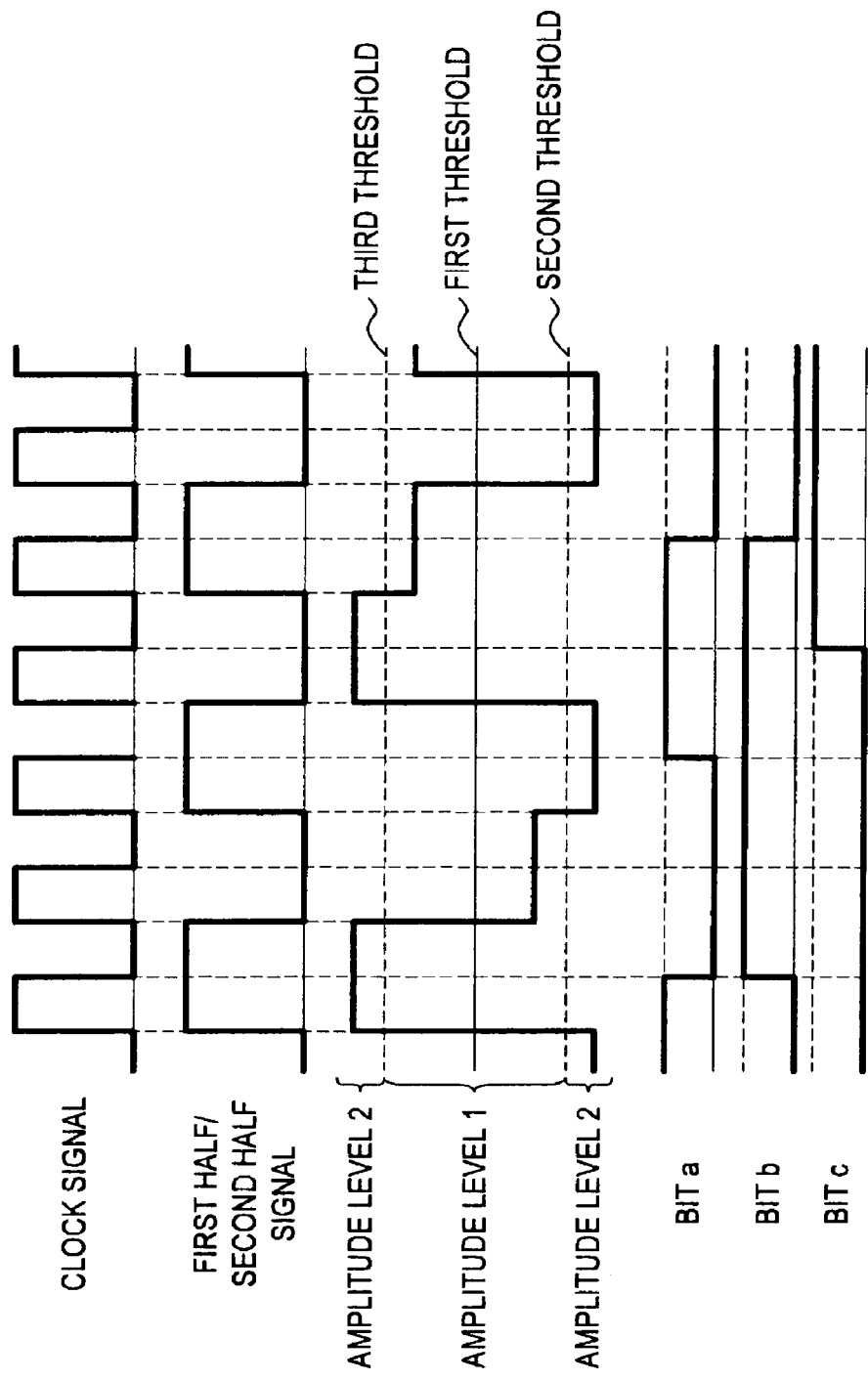
FIG. 23 is an explanatory view showing a concrete example of bit value determination of each bit determination unit.

FIG. 23 is an explanatory view showing a concrete example of bit value determination of each bit determination unit. As shown in FIG. 23, the bit a determination unit 562 determines the value of the bit a based on whether the signal level of a serial signal during a fall of the clock signal, while the first half/second half signal is at a high level, is at a high level or a low level.

The bit b determination unit 564 determines the value of the bit b in accordance with the amplitude level of a serial signal during a fall of the clock signal while the first half/second half signal is at a high level. More specifically, the bit b determination unit 564 may determine that the value of the bit b is "0" if the amplitude level is "1", which is in the range of a second threshold and a third threshold. The bit b determination unit 564 may determine that the value of the bit b is "1" if the amplitude level is "2", which is outside the range of the second threshold and the third threshold.

Similarly, the bit c determination unit 566 determines the value of the bit c in accordance with the amplitude level of a serial signal during a fall of the clock signal while the first half/second half signal is at a low level. More specifically, the bit c determination unit 566 may determine that the value of the bit c is "0" if the amplitude level is "1", which is in the range of a second threshold and a third threshold. The bit c determination unit 566 may determine that the value of the bit c is "1" if the amplitude level is "2", which is outside the range of the second threshold and the third threshold.

As described above, the decoder 254 of the deserializer 208 can appropriately decode a serial signal efficiently encoded by the encoder 234 of the serializer 204. However, only an example of the configuration of the decoder 254 is described above and the present invention is not limited to the decoder 254 described above. Thus, a decoder 254' according to a modification will be described with reference to FIG. 24.

(Decoder Modification)

Figure 24:
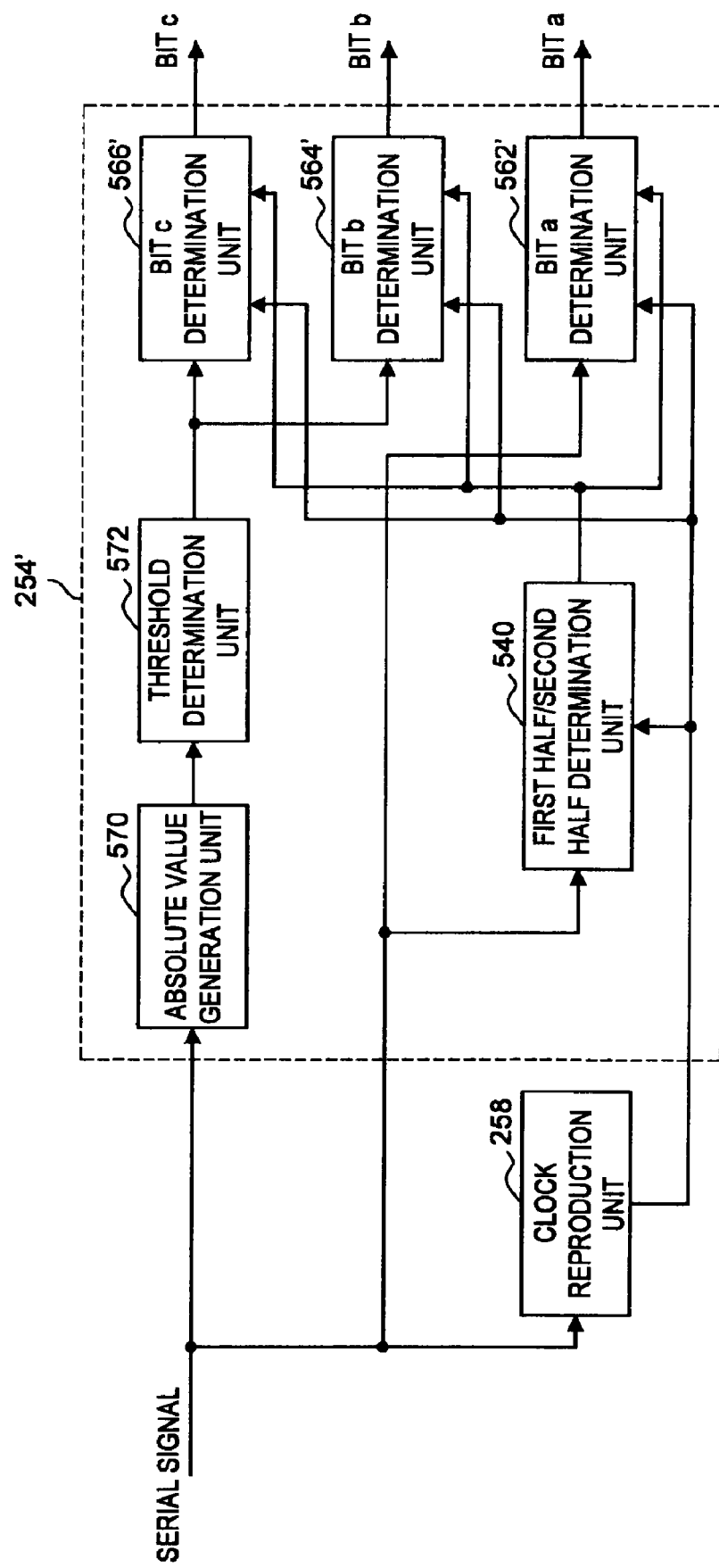
FIG. 24 is a functional block diagram showing the configuration of a decoder according to a modification.
Figure 25:
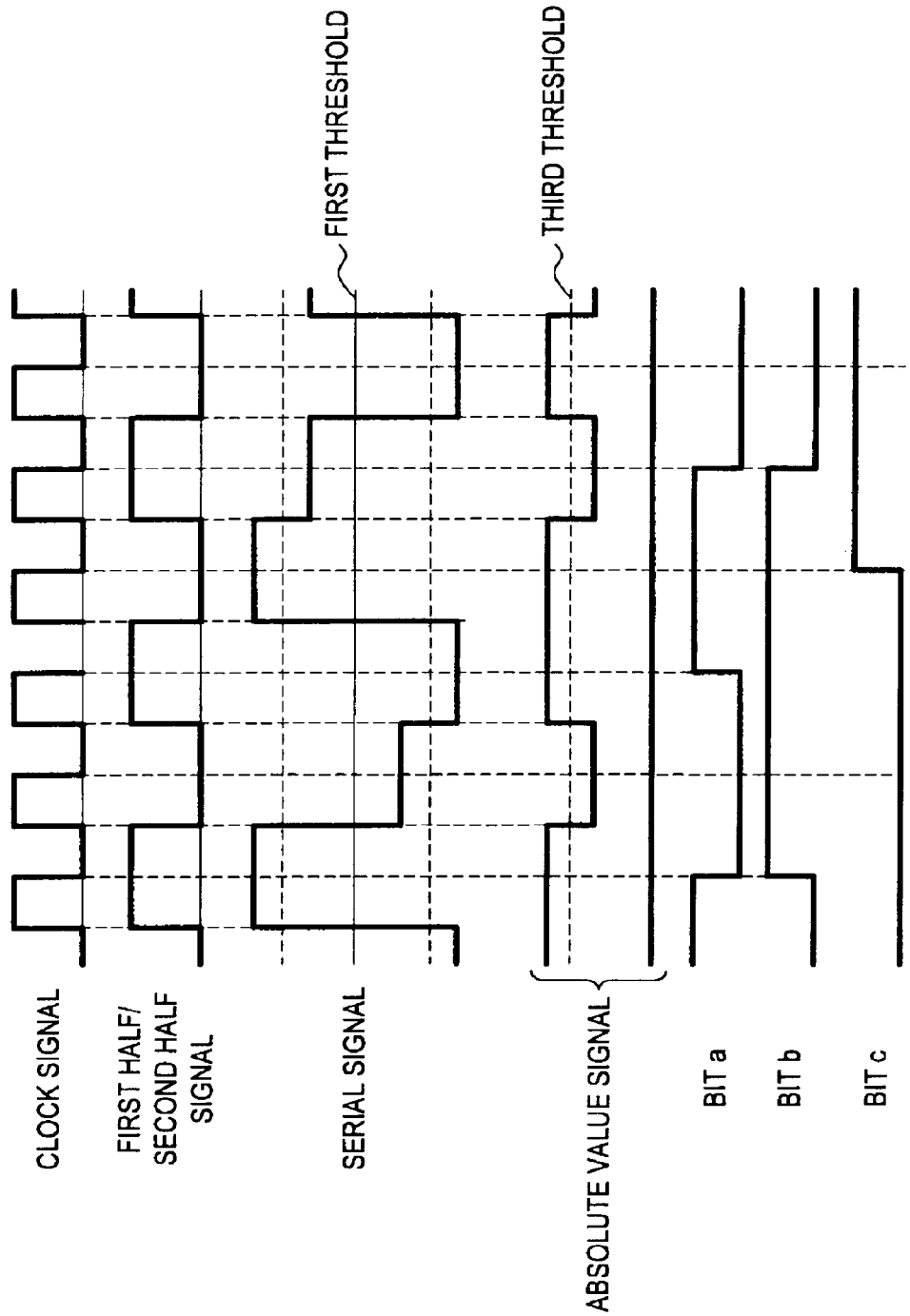
FIG. 25 is an explanatory view showing how a bit determination by the decoder according to the modification is made.

FIG. 24 is a functional block diagram showing the configuration of the decoder 254' according to a modification. FIG. 25 is an explanatory view showing how a bit determination by the decoder 254' according to the modification is made. As shown in FIG. 24, the decoder 254' according to the modification includes the first half/second half determination unit 540, a bit a determination unit 562', a bit b determination unit 564', a bit c determination unit 566', an absolute value generation unit 570, and a threshold determination unit 572. The function of the first half/second half determination unit 540 is the same as described in "Deserializer" and thus, a description thereof is omitted here.

As shown in FIG. 25, the absolute value generation unit 570 generates absolute values of a serial signal by the first threshold and outputs an absolute value signal. Then, the absolute value signal is input into the threshold determination unit 572. If the absolute value signal exceeds the third threshold, the threshold determination unit 572 outputs a high-level signal, and if the absolute value signal falls below the third threshold, the threshold determination unit 572 outputs a low-level signal. An absolute value signal includes a portion representing the value of the bit b and that representing the value of the bit c alternately.

The bit a determination unit 562' binarizes a serial signal by the first threshold during a fall of the clock signal while the first half/second half signal is at a high level and latches and outputs a binarization result. The bit b determination unit 564' latches and outputs a signal input from the threshold determination unit 572 during a fall of the clock signal while the first half/second half signal is at a high level. Similarly, the bit c determination unit 566' latches and outputs a signal input from the threshold determination unit 572 during a fall of the clock signal while the first half/second half signal is at a low level.

As described above, the decoder 254' according to the modification has the advantage in being able to determine the values of the bits a to c by two thresholds (the first and third threshold) to the decoder 254 using three thresholds (the first to third threshold).

(3) Detailed Description of the Second Embodiment

Next, the second embodiment of the present invention will be described. If a serial signal is output by superimposing a clock signal on a data signal in the serializer 204, clock reproduction in the deserializer 208 is simplified. The frequency spectrum of a serial signal in which a clock signal is superimposed will briefly be described with reference to FIG. 26.

Figure 26:
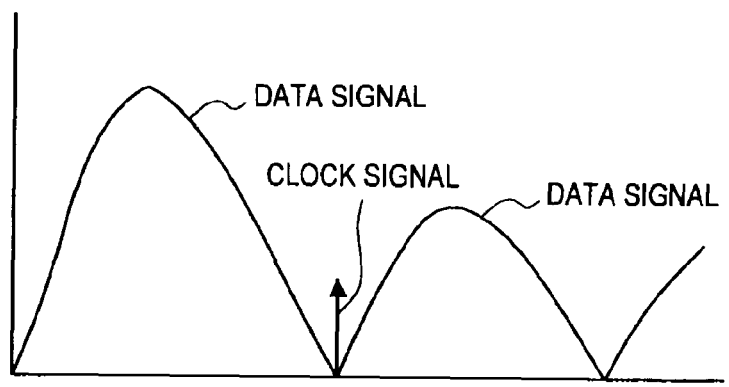
FIG. 26 is an explanatory view schematically showing the frequency spectrum of a serial signal in which a clock signal is superimposed.

FIG. 26 is an explanatory view schematically showing the frequency spectrum of a serial signal in which a clock signal is superimposed. As shown in FIG. 26, the clock signal is superimposed in such a way that there is a signal component at a zero point between a principal wave of the clock signal and harmonics. However, the clock signal is a narrowband signal and thus, if a clock signal having an amplitude equivalent to that of a data signal is superimposed, the clock component may become conspicuous at a specific frequency (observable by a spectrum analyzer), which is not desirable from the standpoint of EMI. Thus, with such circumstances being focused on, the second embodiment has been made. According to the second embodiment of the present invention, an adverse effect of EMI can be suppressed while clock reproduction by the deserializer 208 is simplified. The second embodiment of the present invention described above will be described below with reference to FIG. 27 to FIG. 30.

Figure 27:
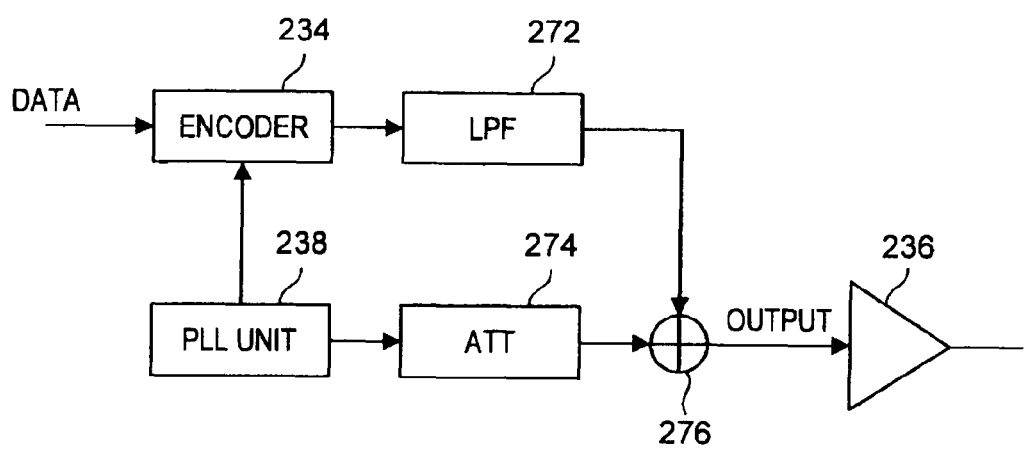
FIG. 27 is a functional block diagram showing the configuration of a portion of a serializer according to a second embodiment.

FIG. 27 is a functional block diagram showing the configuration of a portion of the serializer 204 according to the present embodiment. As shown in FIG. 27, the serializer 204 according to the present embodiment includes the encoder 234, the PLL unit 238, the LVDS driver 236, an LPF 272, an attenuator 274 (ATT), and an adder 276.

The PLL unit 238 generates a clock signal and outputs the generated clock signal to the encoder 234 and the attenuator 274. The encoder 234 encodes data, for example, by the method described in "[2] Detailed description of the first embodiment".

The data signal encoded by the encoder 234 is input into the LPF 272, which functions as a first attenuation unit to attenuate frequency components containing a clock frequency band of a data signal. The attenuator 274 functions as a second attenuation unit to attenuate a clock signal to a predetermined signal level. The adder 276 synthesizes a data signal output from the LPF 272 and a clock signal output from the attenuator 274 and outputs a synthesized signal.

Figure 28:
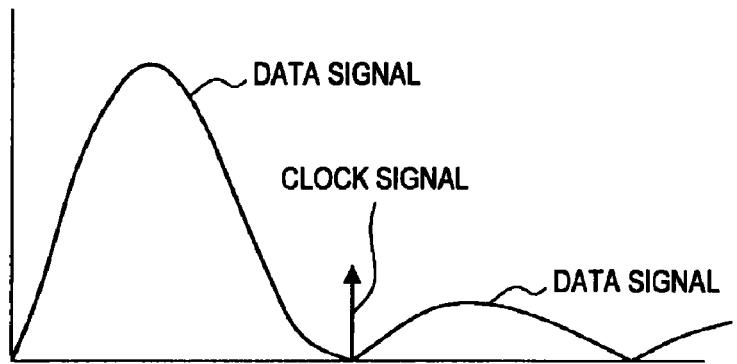
FIG. 28 is an explanatory view schematically showing the frequency spectrum of a signal output from an adder.

FIG. 28 is an explanatory view schematically showing the frequency spectrum of a signal output from the adder 276. According to the present embodiment, as shown in FIG. 28, the SN ratio of a clock component to a data component in the vicinity of the clock frequency can be improved.

Figure 29:
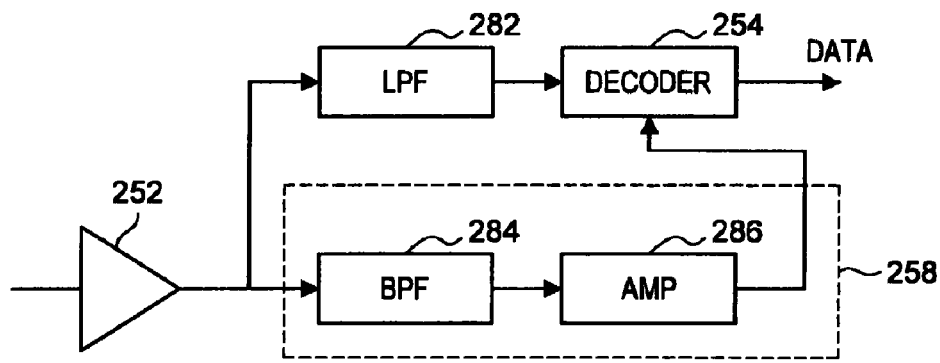
FIG. 29 is a functional block diagram showing the configuration of a portion of a deserializer according to the second embodiment.

FIG. 29 is a functional block diagram showing the configuration of a portion of the deserializer 208 according to the present embodiment. Since a data signal and a clock signal are superimposed in a serial signal (input signal) input from the serializer 204 in the present embodiment, the clock component is arranged at the zero point of the data component, but it is desirable that the clock component and data component do not affect each other adversely. Thus, as shown in FIG. 29, the LVDS receiver 252, the decoder 254, a clock reproduction unit 258 including a BPF 284 and AMP 286, and an LPF 282 are provided in the deserializer 208 according to the present embodiment.

Figure 30:
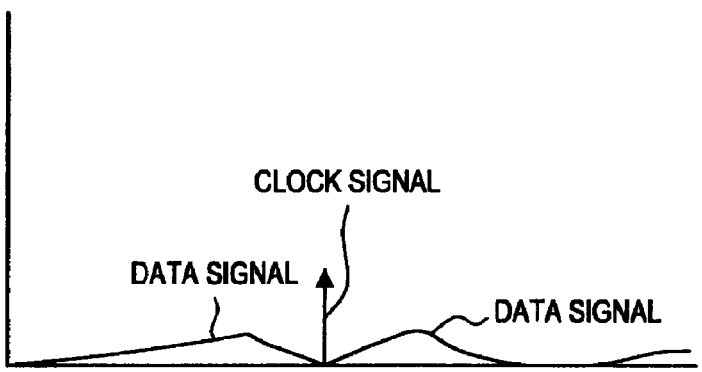
FIG. 30 is an explanatory view schematically showing the frequency spectrum of a signal output from a BPF.

The BPF 284 functions as an extraction unit that extracts and outputs a signal component in the vicinity of the clock frequency from a serial signal in which a data signal and a clock signal are superimposed. FIG. 30 schematically shows the frequency spectrum of a signal output from the BPF 284. As shown in FIG. 30, a signal output from the BPF 284 has a significantly attenuated data component, so that a case in which the clock signal is adversely affected by the data component can be suppressed. A signal output from the BPF 284 in this manner is amplified by the AMP 286 before being supplied to the decoder 254 as a clock signal.

The LPF 282 functions as an attenuation unit that attenuates a signal component in the vicinity of the clock frequency from a serial signal in which a data signal and a clock signal are superimposed and outputs the signal component as a data signal. The data signal output from the LPF 282 in this manner is input into the decoder 254, and the decoder 254 decodes the data signal, for example, by the method described in "[2] Detailed description of the first embodiment" using a clock signal input from the AMP 286.

(4) Summary

According to the first embodiment of the present invention, as described above, the data transmission amount can be increased while suppressing an occurrence of a DC component by applying the Manchester coding mode and making the amplitude levels of the first half and second half of a symbol correspond to bit values. According to the second embodiment of the present invention, an adverse effect by EMI can be suppressed while clock reproduction by the deserializer 208 is simplified by adjusting and superimposing each frequency component of a clock signal and a data signal.

The present application contains subject matter related to that disclosed in Japanese Priority Patent Application JP 2008-140992 filed in the Japan Patent Office on May 29, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

In the above embodiments, for example, an example in which 3 bits are represented by a symbol of Manchester code, but the present invention is not limited to such an example.

That is, the data transmission amount can further be increased by implementing a generation function of more amplitude levels in the encoder 234, making a plurality of bits correspond to the first half amplitude levels, and making a plurality of bits correspond to the second half amplitude levels. For example, a generation function of four amplitude levels may be implemented in the encoder 234, which represents the first bit value by the signal waveform, the second and third bit values each by one of the four amplitude levels in the first half, and the fourth and fifth bit values each by one of the four amplitude levels in the second half.

What is claimed is:

1. A signal processing apparatus, comprising:
   a signal processor for generating a data signal having a signal waveform corresponding to a first bit value of a signal waveform transitioning from a high level to a low level or that transitioning from a low level to a high level;
   a pre-transition signal level corresponding to a second bit value of one of a plurality of high levels or a plurality of low levels; and
   a post-transition signal level corresponding to a third bit value of one of the plurality of high levels or the plurality of low levels, the third bit value being different from the second bit value.

2. The signal processing apparatus according to claim 1, further comprising:
   a clock generation unit that generates a clock signal having a predetermined frequency;
   a first attenuation unit that attenuates a signal component in the vicinity of the predetermined frequency of a data signal generated by the generation unit; and
   an adder that adds the clock signal and the data signal with the signal component attenuated by the first attenuation unit.

3. The signal processing apparatus according to claim 2, further comprising:
   a second attenuation unit that attenuates the clock signal,
   wherein the adder adds a data signal having signal component attenuated by the first attenuation unit and a clock signal attenuated by the second attenuation unit.

4. A signal processing apparatus, comprising:
   a first determination unit that determines a first bit value based on whether a signal waveform of a data signal is a signal waveform transitioning from a high level to a low level or transitioning from a low level to a high level;
   a second determination unit that determines a second bit value based on a pre-transition signal level of the data signal; and
   a third determination unit that determines a third bit value based on a post-transition signal level of the data signal.

5. The signal processing apparatus according to claim 4, further comprising:
   an absolute value generation unit that generates an absolute value of the signal level of the data signal,
   wherein the second determination unit determines the second bit value based on a pre-transition absolute level generated as an absolute value by the absolute value generation unit and the third determination unit determines the third bit value based on a post-transition absolute level generated as an absolute value by the absolute value generation unit.

6. The signal processing apparatus according to claim 4, comprising:
   an input unit into which an input signal containing a clock signal having a predetermined frequency is input;
   an extraction unit that extracts the clock signal from the input signal; and
   an attenuation unit that attenuates a signal component in the vicinity of the predetermined frequency of the input signal and outputs the signal component as the data signal.

7. A signal processing system, comprising:
   a first signal processing apparatus that generates a data signal having a signal waveform corresponding to a first bit value of a signal waveform transitioning from a high level to a low level or that transitioning from a low level to a high level;
   a pre-transition signal level corresponding to a second bit value of one of a plurality of high levels or a plurality of low levels;
   a post-transition signal level corresponding to a third bit value of one of the plurality of high levels or the plurality of low levels, the third bit value being different from the second bit value; and
   a second signal processing apparatus, including
      a first determination unit that determines a first bit value based on whether a signal waveform of a data signal from the first signal processing apparatus is a signal waveform transitioning from the high level to the low level or that transitioning from the low level to the high level,
      a second determination unit that determines the second bit value based on the pre-transition signal level of the data signal, and
      a third determination unit that determines the third bit value based on the post-transition level of the data signal.

8. A signal processing method, using a computer, comprising the steps of:
   selecting one of a signal waveform with a signal level transitioning from a high level to a low level or with a signal level transitioning from a low level to a high level, in accordance with a first bit value;
   generating a data signal having a signal waveform selected during the above step, in which a pre-transition signal level is one of a plurality of high levels or one of a plurality of low levels, and a post-transition signal level is of one of the plurality of high levels or the plurality of low levels, the third bit value being different from the second bit value;
   determining a first bit value based on whether the signal waveform of the data signal is a signal waveform transitioning from the high level to the low level or that transitioning from the low level to the high level;
   determining a second bit value based on the pre-transition level of the data signal; and
   determining a third bit value based on the post-transition level of the data signal.

* * * * *